US008653729B2

(12) United States Patent
Choi et al.

(10) Patent No.: US 8,653,729 B2
(45) Date of Patent: Feb. 18, 2014

(54) ORGANIC LIGHT EMITTING DIODE DISPLAY AND METHOD FOR MANUFACTURING THE SAME

(75) Inventors: Min-Hyuk Choi, Cheongan-si (KR); Chun-Gi You, Hwaseong-si (KR); Jong-Hyun Park, Yongin-si (KR); Young-Dong Kwon, Asan-si (KR); Jin-Hee Kang, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 1036 days.

(21) Appl. No.: 12/420,546

(22) Filed: Apr. 8, 2009

(65) Prior Publication Data
US 2010/0090594 A1    Apr. 15, 2010

(30) Foreign Application Priority Data

Oct. 13, 2008    (KR) .......................... 10-2008-0100140

(51) Int. Cl.
*H01J 1/62*    (2006.01)
*H01J 9/00*    (2006.01)
(52) U.S. Cl.
USPC .......................................... 313/506; 313/504
(58) Field of Classification Search
USPC ............... 313/504–512; 445/24, 25; 428/690; 257/90
See application file for complete search history.

(56) References Cited

U.S. PATENT DOCUMENTS

| 2005/0225232 | A1* | 10/2005 | Boroson et al. ............... 313/504 |
| 2005/0263765 | A1* | 12/2005 | Maekawa ........................ 257/69 |
| 2005/0280364 | A1 | 12/2005 | Omura |
| 2006/0132685 | A1* | 6/2006 | You ................................. 349/114 |
| 2007/0013302 | A1 | 1/2007 | Song |
| 2007/0138478 | A1* | 6/2007 | Son et al. ......................... 257/72 |
| 2008/0048948 | A1* | 2/2008 | Koh et al. ........................ 345/80 |
| 2008/0117345 | A1* | 5/2008 | Ishii et al. ........................ 349/40 |
| 2009/0315451 | A1* | 12/2009 | Choi et al. ..................... 313/504 |

FOREIGN PATENT DOCUMENTS

| JP | 2005108736 | 4/2005 |
| JP | 2005197011 | 7/2005 |
| JP | 2008515129 | 5/2008 |
| JP | 2008515131 | 5/2008 |
| KR | 1020050070388 | 7/2005 |
| KR | 1020070058765 | 6/2007 |
| KR | 1020070071490 | 7/2007 |
| KR | 100778442 | 11/2007 |
| KR | 1020080041939 | 5/2008 |
| KR | 1020080054547 | 6/2008 |

* cited by examiner

*Primary Examiner* — Nimeshkumar Patel
*Assistant Examiner* — Jacob R Stern
(74) *Attorney, Agent, or Firm* — H.C. Park & Associates, PLC

(57) ABSTRACT

The present invention relates to an organic light emitting device and a manufacturing method thereof. The present invention discloses an organic light emitting device including: a plurality of scanning signal lines; a first and second contact assistant; a plurality of data lines crossing the scanning signal lines; a driving voltage line; and a first pixel, a second pixel, and a third pixel alternately arranged, wherein each pixel includes: a switching transistor, a driving transistor including an output terminal, a pixel electrode connected to the output terminal, the pixel electrode including at least two layers including a transflective electrode, an organic light emitting member arranged on the pixel electrode, and a common electrode arranged on the organic light emitting member, wherein the first pixel further includes a supplementary member arranged on the pixel electrode, and wherein the first and second contact assistants include the same material as the supplementary member.

13 Claims, 28 Drawing Sheets

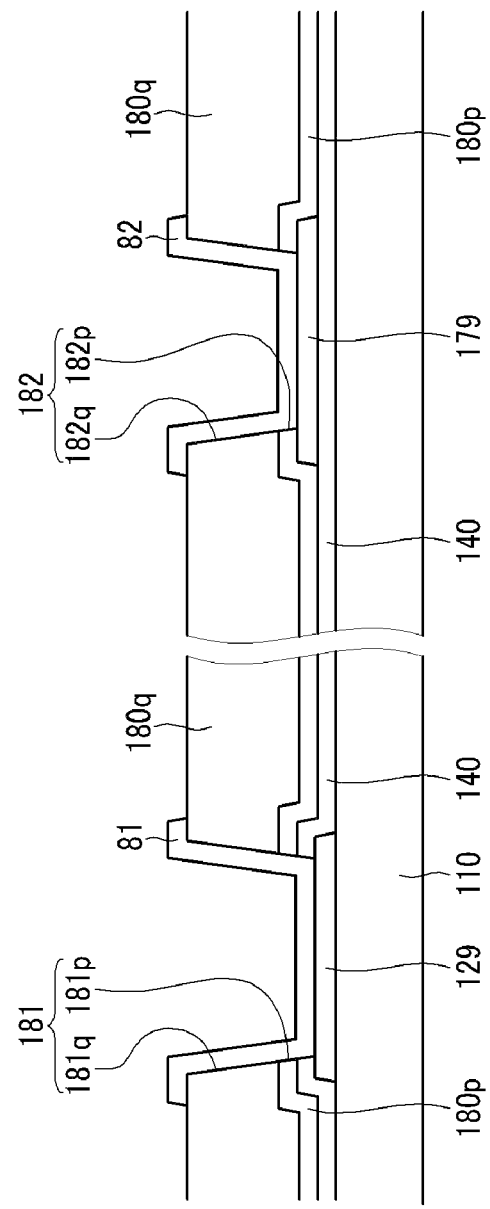

ORGANIC LIGHT EMITTING DIODE DISPLAY AND METHOD FOR MANUFACTURING THE SAME

CROSS REFERENCE TO RELATED APPLICATION

This application claims priority from and the benefit of Korean Patent Application No. 10-2008-0100140 filed on Oct. 13, 2008, which is hereby incorporated by reference for all purposes as if fully set forth herein.

BACKGROUND OF THE INVENTION

1. Field of the Invention

The present invention relates to an organic light emitting device and a manufacturing method thereof.

2. Discussion of the Background

An organic light emitting device includes two electrodes and an organic light emitting layer disposed between the two electrodes. One of the two electrodes injects holes and the other injects electrons into the light emitting layer. The injected electrons and holes combine to form excitons, which emit light as discharged energy.

Because an organic light emitting device is a self-emissive display device, an additional light source is not necessary. Thus, an organic light emitting device may have lower power consumption as well as high response speed, wide viewing angle, and high contrast ratio.

An organic light emitting device includes a plurality of pixels such as red pixels, blue pixels, green pixels, and white pixels. Full color images may be displayed by selectively combining these pixels.

Each pixel of an organic light emitting device includes an organic light emitting element and a plurality of thin film transistors for driving the organic light emitting element.

An organic light emitting element includes an anode and a cathode as its two electrodes, and an organic light emitting member as an emission layer disposed therebetween. The organic light emitting member may emit light of three primary colors such as red, green, and blue, or white light. The material of an organic light emitting member may be different according to the color of light emitted by the organic light emitting member. A method including stacking light emitting materials that emit red, green, and blue light, so that the synthesized light becomes white, may be used when the organic light emitting member emits white light. Moreover, in a case where the organic light emitting member emits white light, color filters may be added to obtain light of a desired color.

The thin film transistors include a switching transistor for switching a voltage applied to each pixel and a driving transistor for driving the organic light emitting element. The switching transistor may be connected to signal lines such as a scanning signal line, which transmits a scanning signal, and a data line, which transmits a data signal, and the various signals may be applied through pad portions located outside a display unit.

SUMMARY OF THE INVENTION

The present invention provides an organic light emitting device and a manufacturing method thereof.

Additional features of the invention will be set forth in the description which follows, and in part will be apparent from the description, or may be learned by practice of the invention.

The present invention discloses an organic light emitting device including: a plurality of scanning signal lines, each scanning signal line transmitting a scanning signal and comprising an end portion; a first contact assistant connected to the end portion of the scanning signal line; a plurality of data lines crossing the scanning signal lines, each data line transmitting a data signal and comprising an end portion; a second contact assistant connected to the end portion of the data line; a driving voltage line to transmit a driving voltage; and a first pixel, a second pixel, and a third pixel alternately arranged, wherein each first pixel, second pixel, and third pixel comprises a switching transistor connected to the scanning signal line and the data line, a driving transistor connected to the switching transistor and the driving voltage line, the driving transistor comprising an output terminal, a pixel electrode connected to the output terminal, the pixel electrode comprising at least two layers comprising a transflective electrode, an organic light emitting member arranged on the pixel electrode, and a common electrode arranged on the organic light emitting member, wherein the first pixel further comprises a supplementary member arranged on the pixel electrode, and wherein the first contact assistant and the second contact assistant each comprise the same material as the supplementary member.

The present invention also discloses a method of manufacturing an organic light emitting device, the method including: providing a substrate including a first region, a second region, and a third region; forming a plurality of signal lines on the substrate, each signal line including an end portion; forming a plurality of output electrodes on the substrate; forming a passivation layer on the signal lines and the output electrodes; forming a first contact hole by etching the passivation layer, the first contact hole exposing the output electrode; depositing a conductor layer on the passivation layer, the conductor layer including at least two layers including a transflective electrode layer; forming a first photosensitive film pattern on the conductor layer corresponding to the first region, the second region, and the third region; etching the conductor layer using the first photosensitive film pattern as a mask to remove the conductor layer at a position corresponding to the end portion of the signal line and to form a pixel electrode at each position corresponding to the first region, the second region, and the third region; removing the first photosensitive film pattern; forming a second photosensitive film pattern that exposes the pixel electrode at a position corresponding to one or two of the first region, the second region, and the third region, the second photosensitive film pattern covering the remaining pixel electrodes and exposing the passivation layer at a position corresponding to the end portion of the signal line; forming a second contact hole exposing the end portion of the signal line by etching the passivation layer using the second photosensitive film pattern as a mask; depositing a conductive supplementary member layer on the second photosensitive film pattern; and patterning the conductive supplementary member layer to form a supplementary member arranged on the pixel electrode not covered by the second photosensitive film pattern and to form a contact assistant that contacts the end portion of the signal line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, show exemplary embodiments of the invention, and together with the description serve to explain the principles of the invention.

FIG. 27 and FIG. 28 are cross-sectional views of the organic light emitting device shown in FIG. 26 taken along lines XXVII-XXVII'-XXVII"-XXVII'" and XXVIII-XXVIII'-XXVIII".

DETAILED DESCRIPTION OF THE ILLUSTRATED EMBODIMENTS

Figure 1:
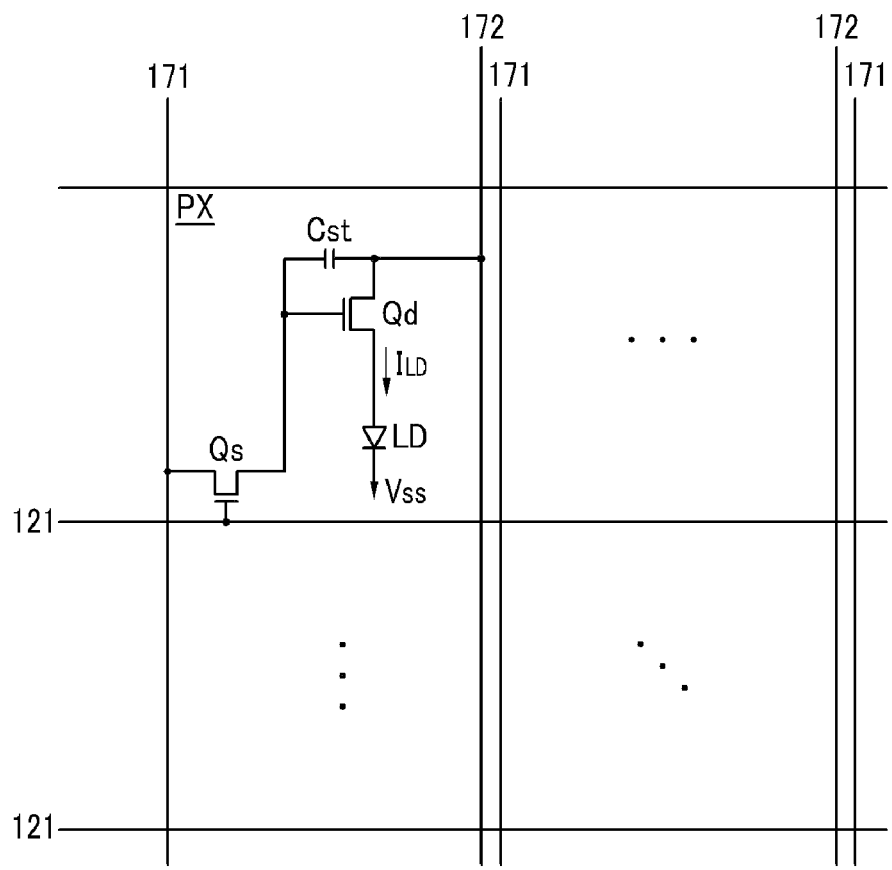
FIG. 1 is an equivalent circuit diagram of an organic light emitting device in accordance with an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

An organic light emitting device according to an exemplary embodiment of the present invention will be described in detail below with reference to FIG. 1.

FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of scanning signal lines 121 to transmit a gate signal (or a scanning signal), a plurality of data lines 171 to transmit a data signal, and a plurality of driving voltage lines 172 to transmit a driving voltage. The scanning signal lines 121 extend in a row direction and are substantially parallel to each other, and the data lines 171 extend in a column direction and are substantially parallel to each other. Although the driving voltage lines 172 are shown as extending in a column direction, the driving voltage lines 172 may extend in a row direction or in a column direction, or may be formed in a matrix.

Each pixel PX includes a switching transistor Qs, a driving transistor Qd, a storage capacitor Cst, and an organic light emitting element LD.

The switching transistor Qs includes a control terminal, an input terminal, and an output terminal, in which the control terminal is connected to the scanning signal line 121, the input terminal is connected to the data line 171, and the output terminal is connected to the driving transistor Qd. The switching transistor Qs transmits the data signal received from the data line 171 to the driving transistor Qd in response to the scanning signal received from the scanning signal line 121.

The driving transistor Qd also includes a control terminal, an input terminal, and an output terminal, in which the control terminal is connected to the switching transistor Qs, the input terminal is connected to the driving voltage line 172, and the output terminal is connected to the organic light emitting element LD. The driving transistor Qd applies an output current $I_{LD}$ of which the magnitude varies according to the voltage applied between the control terminal and the output terminal.

The capacitor Cst is connected between the control terminal and the input terminal of the driving transistor Qd. The capacitor Cst stores a data signal applied to the control terminal of the driving transistor Qd and maintains the stored data signal even after the switching transistor Qs is turned off.

The organic light emitting element LD is an organic light emitting diode (OLED), which may include an anode connected to the output terminal of the driving transistor Qd and a cathode connected to a common voltage Vss. The organic light emitting element LD emits light of which the intensity is varied according to the output current $I_{LD}$ of the driving transistor Qd, to display an image. The organic light emitting element LD may include an organic material emitting light of at least one primary color such as red, green, and blue, or may include an organic material emitting white light. The organic light emitting device displays a desired image by a spatial sum thereof.

The switching transistor Qs and the driving transistor Qd each may be an n-channel field effect transistor (FET). However, at least one of the switching transistor Qs and the driving transistor Qd may be a p-channel FET. Moreover, the connection relationship among the transistors Qs and Qd, the storage capacitor Cst, and the organic light emitting element LD may be modified.

A structure of the organic light emitting device shown in FIG. 1 will be described in detail below with reference to FIG. 2, FIG. 3, and FIG. 4 as well as FIG. 1.

Figure 2:
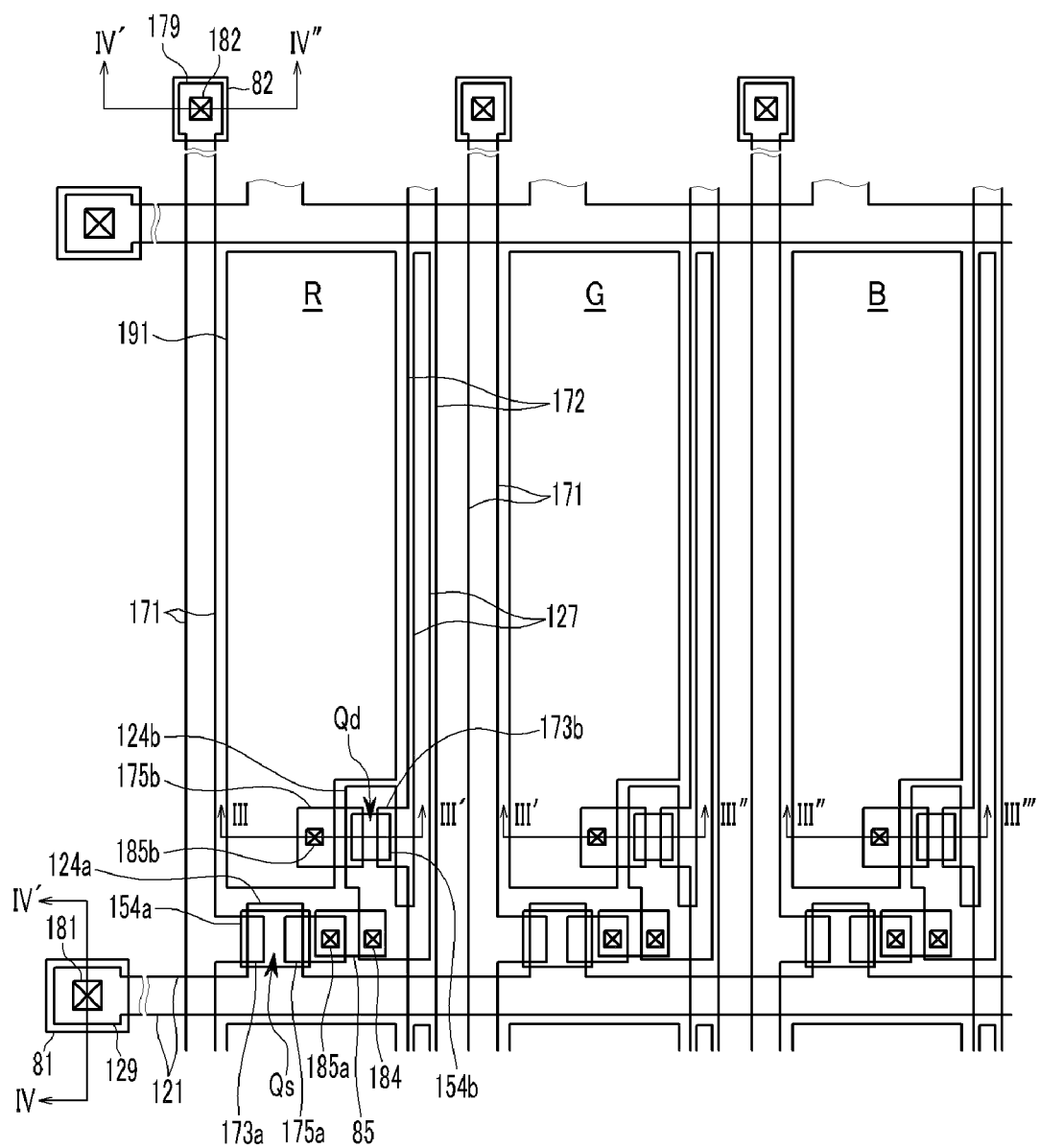
FIG. 2 is a layout view of three neighboring pixels of an organic light emitting device according to an exemplary embodiment of the present invention.
Figure 3:
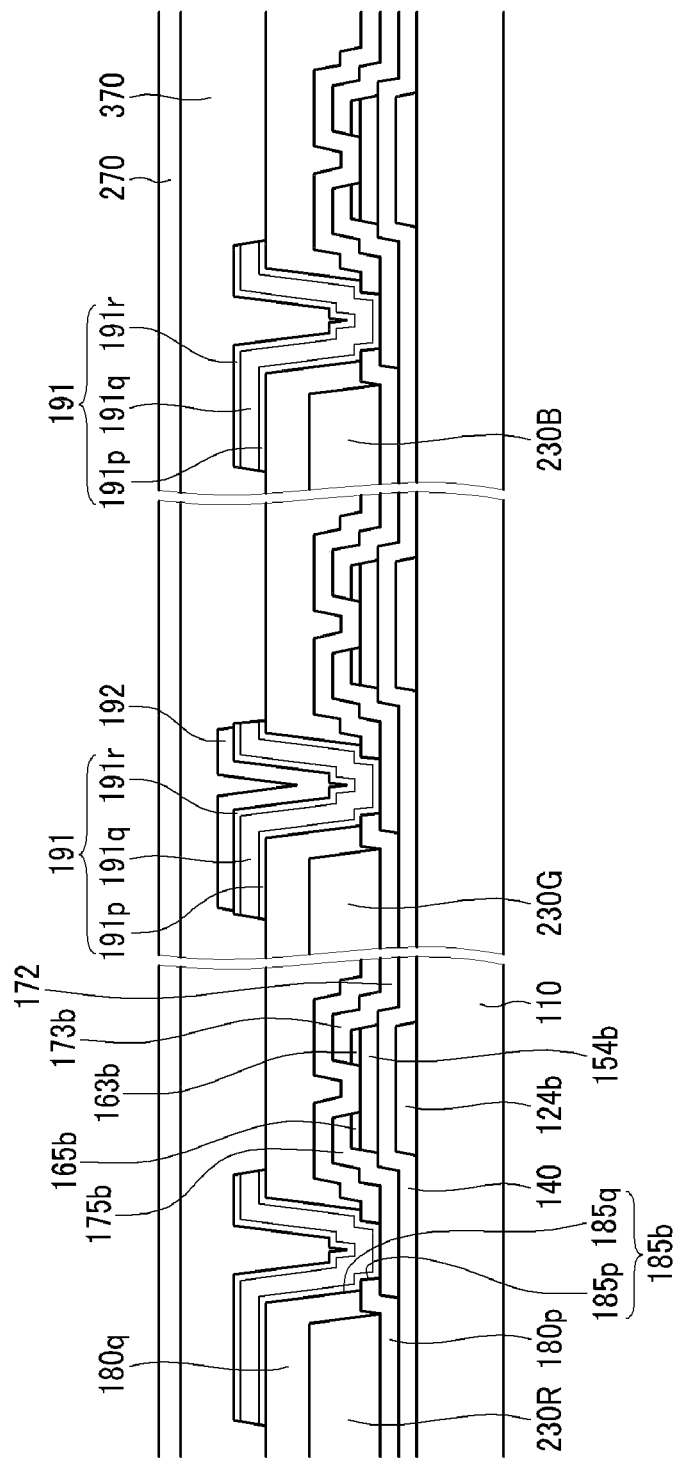
FIG. 3 and FIG. 4 are cross-sectional views of the organic light emitting device shown in FIG. 2 taken along lines III-III'-III"-III'" and IV-IV'-IV", respectively.
Figure 4:
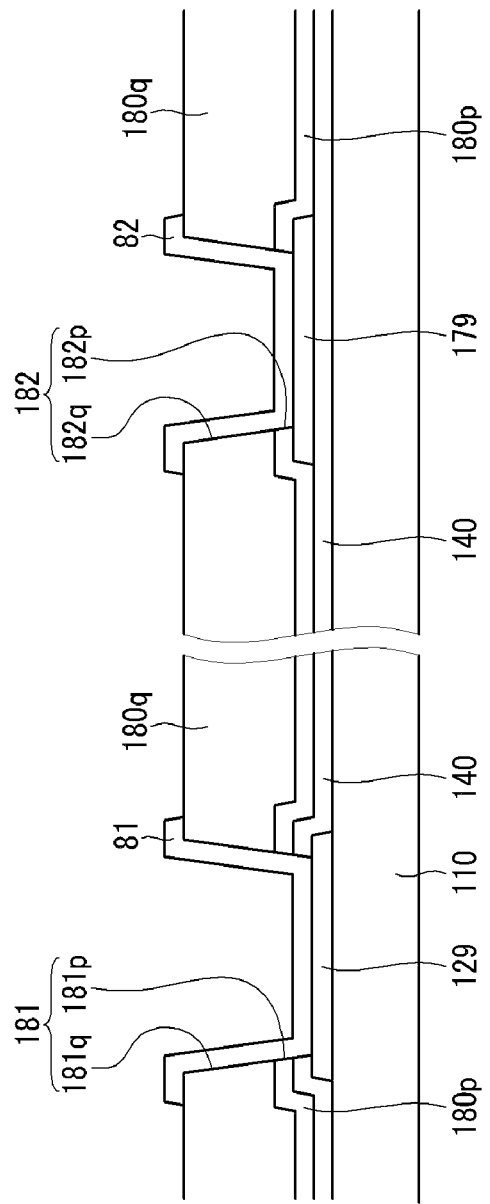

FIG. 2 is a layout view of three neighboring pixels of an organic light emitting device according to an exemplary embodiment of the present invention, and FIG. 3 and FIG. 4 are cross-sectional views of the organic light emitting device shown in FIG. 2 taken along lines III-III'-III"-III'" and IV-IV'-IV", respectively.

Referring to FIG. 2, an organic light emitting device according to an exemplary embodiment of the present invention includes red pixels R for displaying red light, green pixels G for displaying green light, and blue pixels B for displaying blue light, which are sequentially and alternately disposed. Three pixels including the red pixel R, the green pixel G, and the blue pixel B form one group, and the group of pixels may be repeatedly arranged according to rows and/or columns. However, arrangement and shapes of the pixels may be variously changed.

The structures of the three pixels R, G, and B are substantially the same, and the same constituent elements are designated by the same reference numerals.

Referring to FIG. 2, FIG. 3, and FIG. 4, a plurality of gate conductors including a plurality of scanning signal lines 121 that include a plurality of first control electrodes 124a, and a plurality of second control electrodes 124b that include a plurality of storage electrodes 127, are disposed on an insulation substrate 110 made of a material such as transparent glass or plastic.

The scanning signal lines 121 transmit gate signals and extend substantially in the transverse direction. Each scanning signal line 121 includes an end portion 129 having a large area for contact with another layer or an external driving circuit, and the first control electrodes 124a extend upward from the scanning signal line 121. When a scan driver (not shown) for generating scanning signals is integrated onto the insulation substrate 110, the gate lines 121 may be directly connected to the scan driver.

The second control electrodes 124b are separated from the scanning signal line 121 and include storage electrodes 127 extending in the column direction.

A gate insulating layer 140, which may be made of silicon nitride (SiNx), silicon oxide (SiOx), or so on, is disposed on the gate conductors.

A plurality of first and second semiconductor islands 154a and 154b are formed on the gate insulating layer 140. The first semiconductor islands 154a are disposed on the first control electrodes 124a, and the second semiconductor islands 154b are disposed on the second control electrodes 124b.

A plurality of pairs of first ohmic contacts (not shown) and a plurality of pairs of second ohmic contacts 163b and 165b are respectively disposed on the first and second semiconductor islands 154a and 154b. The first ohmic contacts (not shown) are disposed as a pair on the first semiconductor island 154a, and the second ohmic contacts 163b and 165b are disposed as a pair on the second semiconductor island 154b.

A plurality of data conductors including a plurality of data lines 171, a plurality of driving voltage lines 172, and a plurality of first and second output electrodes 175a and 175b are disposed on the ohmic contacts 163b and 165b and on the gate insulating layer 140.

The data lines 171 transmit data signals and extend in the column direction, thereby crossing the scanning signal lines 121. Each data line 171 includes a plurality of first input electrodes 173a extending toward the first control electrodes 124a and an end portion 179 having a large area for contact with another layer or an external driving circuit. When a data driving circuit (not shown) for generating the data signals is integrated onto the insulation substrate 110, the data lines 171 may be directly connected to the data driving circuit.

The driving voltage lines 172 transmit driving voltages and extend in a column direction, thereby crossing the scanning signal lines 121. Each driving voltage line 172 includes a plurality of second input electrodes 173b extending toward the second control electrodes 124b, and the driving voltage line 172 includes a portion overlapping the storage electrodes 127.

The first and second output electrodes 175a and 175b are separated from each other, and are separated from the data lines 171 and the driving voltage lines 172. The first input electrodes 173a and the first output electrodes 175a oppose each other on the first control electrodes 124a, and the second input electrodes 173b and the second output electrodes 175b oppose each other on the second control electrodes 124b.

The first control electrode 124a, the first input electrode 173a, and the first output electrode 175a form the switching transistor Qs along with the first semiconductor island 154a, and the channel of the switching transistor Qs is formed in the first semiconductor island 154a between the first input electrode 173a and the first output electrode 175a. The second control electrode 124b, the second input electrode 173b, and the second output electrode 175b form the driving transistor Qd along with the second semiconductor island 154b, and the channel of the driving transistor Qd is formed in the second semiconductor island 154b between the second input electrode 173b and the second output electrode 175b. The width of the channel of the driving transistor Qd may be increased or the length of the channel may be decreased to increase the driving current.

The ohmic contacts 163b and 165b are only disposed between the underlying semiconductors islands 154a and 154b and the overlying data conductor, thereby reducing contact resistance therebetween. The first and second semiconductor islands 154a and 154b each have a portion that is exposed without being covered by the data conductor. This exposed portion is between the first and second input electrodes 173a and 173b and the first and the second output electrode 175a and 175b.

A lower passivation layer 180p, which may be made of an inorganic insulator such as silicon nitride or silicon oxide, is formed on the data conductors, the exposed semiconductor islands 154a and 154b, and the gate insulating layer 140.

Red color filters 230R at the red pixels R, green color filters 230G at the green pixels G, and blue color filters 230B at the blue pixels B are respectively disposed on the lower passivation layer 180p. The color filters 230R, 230G, and 230B may not be formed on portions where the first and second control electrodes 124a and 124b and the first and second semiconductor islands 154a and 154b are disposed. The lower passivation layer 180p may prevent pigments of the color filters 230R, 230G, and 230B from flowing into the exposed semiconductor islands 154a and 154b.

An upper passivation layer 180q is disposed on the color filters 230R, 230G, and 230B, and the lower passivation layer 180p. The upper passivation layer 180q may be made of an organic material and may have a flat surface.

The lower passivation layer 180p and the upper passivation layer 180q have a plurality of contact holes 182p, 182q, 185p, and 185*q* respectively exposing the end portions 179 of the data lines 171, and the first and second output electrodes 175*a* and 175*b*. The contact holes 182*p* and 182*q* form a data contact hole 182, contact holes (not shown) exposing the first output electrode 175*a* form a first contact hole 185*a*, and the contact holes 185*p* and 185*q* form a second contact hole 185*b*.

The lower passivation layer 180*p*, the upper passivation layer 180*q*, and the gate insulating layer 140 have a contact hole 184 exposing the second control electrode 124*b* and contact holes 181*p* and 181*q* exposing the end portion 129 of the scanning signal line 121. The contact holes 181*p* and 181*q* form a gate contact hole 181.

A plurality of pixel electrodes 191 at the respective pixels R, G, and B, supplementary members 192 (corresponding to the green pixel G), a plurality of connecting members 85, and a plurality of contact assistants 81 and 82 are disposed on the upper passivation layer 180*q*.

Each pixel electrode 191 of the red, green, and blue pixels R, G, and B comprises a lower electrode 191*p* and an upper electrode 191*r* that may be made of a conductive metal oxide such as indium tin oxide (ITO) or indium zinc oxide (IZO), and includes a transflective metal electrode 191*q* disposed between the lower and upper electrodes 191*p* and 191*r*. Also, a supplementary member 192 that may be made of a transparent conductive material such as ITO or IZO is disposed on the pixel electrode 191 of the green pixel G.

The transflective metal electrode 191*q* may be made of a highly reflective metal such as silver (Ag) and aluminum (Al), and the thickness thereof may be in the range of about 50 Å-250 Å. As such, even when a metal is used, if the metal layer is thin enough, the metal layer has transflective characteristics so that incident light is both reflected and transmitted.

The lower and upper electrodes 191*p* and 191*r* are respectively disposed under and on the transflective metal electrode 191*q*, which may thereby improve cohesiveness between the transflective metal electrode 191*q* and another layer as well as prevent corrosion. The lower electrode 191*p* may protect the transflective metal electrode 191*q* from oxygen or moisture that may flow from the upper passivation layer 180*q*.

Alternatively, the pixel electrodes 191 may have a multi-layer structure including three or more layers according to another exemplary embodiment. According to another exemplary embodiment, the lower electrode 191*p* or the upper electrode 191*r* of the pixel electrode 191 may be omitted.

The pixel electrodes 191 are connected to the second output electrode 175*b* through the second contact hole 185*b*.

The connecting members 85 are connected to the first output electrode 175*a* and the second control electrode 124*b* through the first contact hole 185*a* and the contact hole 184, respectively. The cross-sectional structure of the connecting member 85 of the pixels R, G, and B may be the same as the cross-sectional structure of the previously described pixel electrode 191. The connecting member 85 of the green pixel G may have the same cross-sectional structure as that of the pixel electrode 191 and the supplementary member 192 of the green pixel G.

The contact assistants 81 and 82 are respectively connected to the end portion 129 of the scanning signal line 121 and the end portion 179 of the data line 171 through the contact holes 181 and 182. As shown in FIG. 4, the contact assistants 81 and 82 may have a single-layered structure that may be made of a transparent conductive material such as ITO or IZO. In this case, the contact assistants 81 and 82 may be made of the same material as the supplementary member 192 of the green pixel G, and have the same thickness. The contact assistants 81 and 82 may improve adhesiveness between the end portions 129 and 179 of the scanning signal line 121 and the data line 171 and external devices, and protect them. In this way, the contact assistants 81 and 82 may have a single-layered structure made of ITO or IZO, differently from the cross-sectional structure of the pixel electrode 191, such that contact resistance between the end portions 129 and 179 and the external device may be prevented from being increased and fluctuated. Also, the on-current Ion of the switching and driving transistors Qs and Qd may be prevented from being deteriorated, the characteristics of the transistors Qs and Qd may be stabilized, and display characteristics of an organic light emitting device may be improved.

Again referring to FIG. 2, FIG. 3, and FIG. 4, a white organic light emitting member 370 is disposed on the whole surface of the upper passivation layer 180*q*, the pixel electrode 191, and the supplementary member 192 (corresponding to the green pixel G). The white organic light emitting member 370 may have a structure including a plurality of organic materials emitting light of different primary colors.

A common electrode 270, which transmits a common voltage Vss, is disposed on the whole surface of the organic light emitting member 370. The common electrode 270 may be made of a reflective metal including calcium (Ca), barium (Ba), magnesium (Mg), aluminum (Al), and silver (Ag).

An encapsulation layer (not shown) may be formed on the common electrode 270. The encapsulation layer encapsulates the organic light emitting member 370 and the common electrode 270 such that external moisture and/or oxygen may be prevented from penetrating the organic light emitting device.

In the organic light emitting device of the present exemplary embodiment, the pixel electrode 191 of the red and blue pixels R and B or the supplementary member 192 of the green pixel G, the organic light emitting member 370, and the common electrode 270 form an organic light emitting element LD having the pixel electrode 191 or the supplementary member 192 as an anode, and the common electrode 270 as a cathode, or vice versa. Also, the storage electrode 127 and the driving voltage line 172 that overlap each other form a storage capacitor Cst.

The organic light emitting device emits light toward the insulation substrate 110 to display images. Light emitted toward the insulation substrate 110 from the organic light emitting member 370 passes through the supplementary member 192 (only corresponding to the green pixel G) and the upper electrode 191*r*, and arrives at the transflective metal electrode 191*q*. The incident light is reflected near the transflective metal electrode 191*q* toward the common electrode 270, and the common electrode 270 reflects the light again toward the transflective metal electrode 191*q*. Accordingly, light reciprocating between the transflective metal electrode 191*q* and the common electrode 270 is subjected to an optical process such as interference, and passes through the transflective metal electrode 191*q* and the color filters 230R, 230G, and 230B to the outside if a predetermined condition is satisfied. This reciprocating and interference process is referred to as a microcavity effect. Through the microcavity effect, the intensity of light corresponding to a specific wavelength range may be enhanced.

Here, the optical path length of the microcavity is determined according to the thickness and the refractive indices of the thin films disposed between the transflective metal electrode 191*q* and the common electrode 270 such that light of wavelengths corresponding to each of the primary colors may be enhanced by appropriately selecting the thickness and materials of the thin films. In the present exemplary embodiment, the thickness and the refractive indices of the upper electrode 191*r* and the organic light emitting member 370 of the red and blue pixels R and B may be selected so that intensity of light corresponding to red and blue wavelengths may be enhanced, and the thickness and refractive indices of the supplementary member 192 and the upper electrode 191r of the green pixel G may be selected so that intensity of light corresponding to green wavelengths may be enhanced. Accordingly, the desired optical characteristics may be obtained. For example, light having the desired range of wavelengths and color purity for each of the primary colors may be obtained, so that light emission efficiency and color reproducibility of an organic light emitting device may be improved.

In the present exemplary embodiment, when the transflective metal electrode 191q is formed with a thin metal film, deviation of the thickness of the transflective metal electrode 191q is so small that desired optical characteristics, for example deviation of color purity, may be reduced.

According to another exemplary embodiment, differently from the above-described embodiment wherein the green pixel G comprises the supplementary member 192, the red pixel R and the blue pixel B may comprise supplementary members (not shown) disposed on the pixel electrodes 191 and the green pixel G does not comprise any supplementary member. In this case, thickness and refractive indices of various thin films including the supplementary members may be appropriately selected so that light having the desired range of wavelengths of and color purity for each of the primary colors of red, green and blue may be obtained.

A manufacturing method of the organic light emitting device will be described below with reference to FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25, and FIG. 26 as well as FIG. 2, FIG. 3, and FIG. 4.

Figure 11:
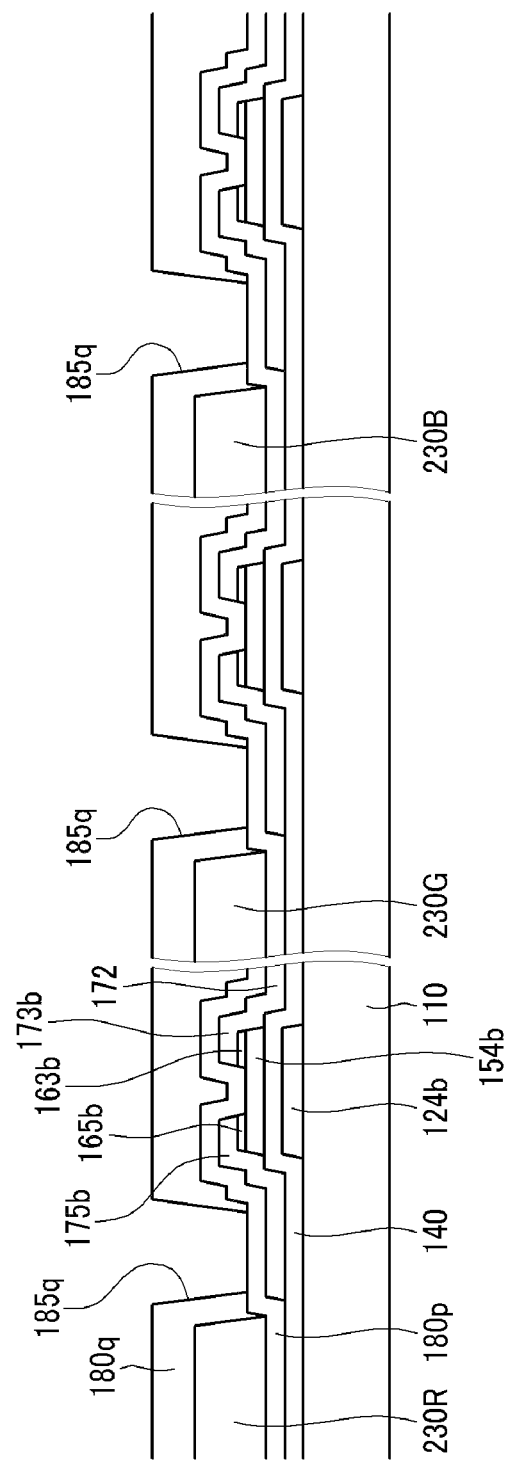
FIG. 11 and FIG. 12 are cross-sectional views of the organic light emitting device shown in FIG. 8 taken along lines IX-IX'-IX"-IX'" and X-X'-X", and showing an intermediate step following that of FIG. 9 and FIG. 10.
Figure 12:
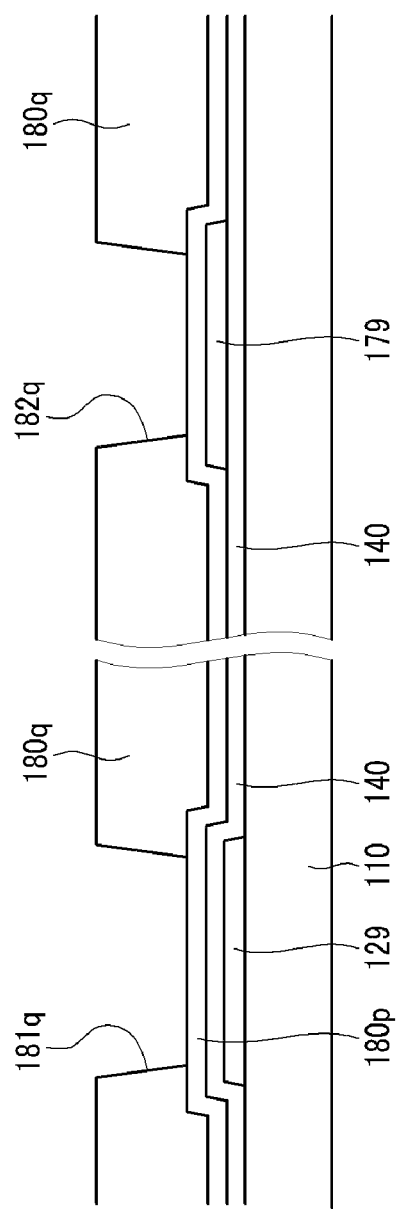
Figure 16:
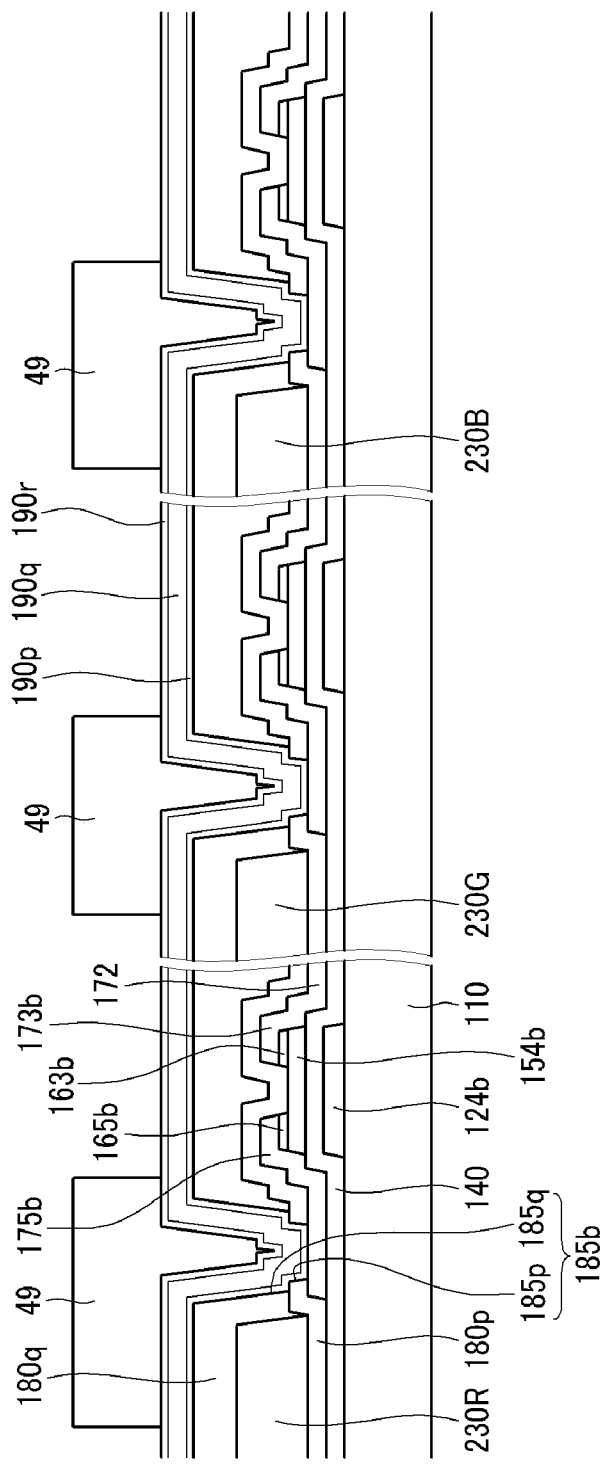
FIG. 16 and FIG. 17 are cross-sectional views of the organic light emitting device shown in FIG. 13 taken along lines XIV-XIV'-XIV"-XIV'" and XV-XV'-XV", and showing an intermediate step following that of FIG. 14 and FIG. 15.
Figure 17:
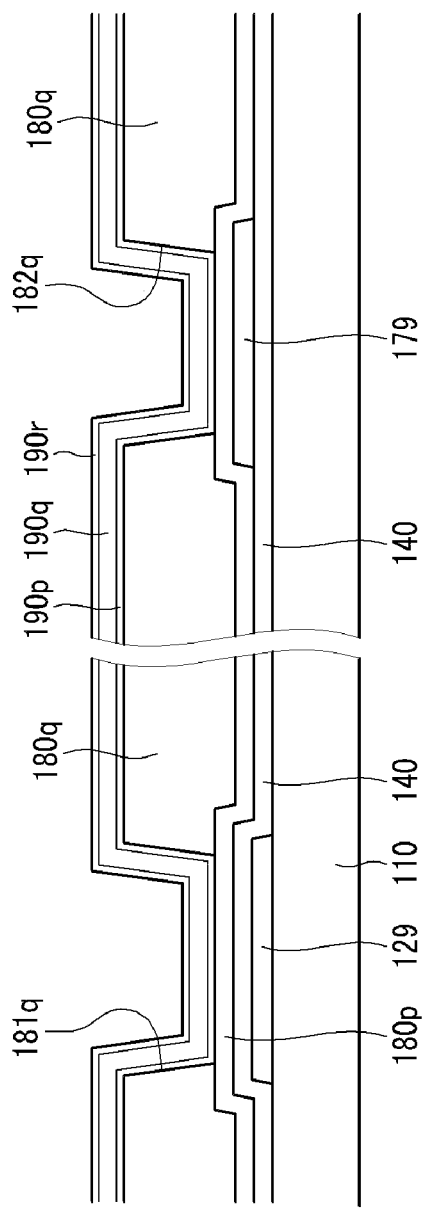
Figure 24:
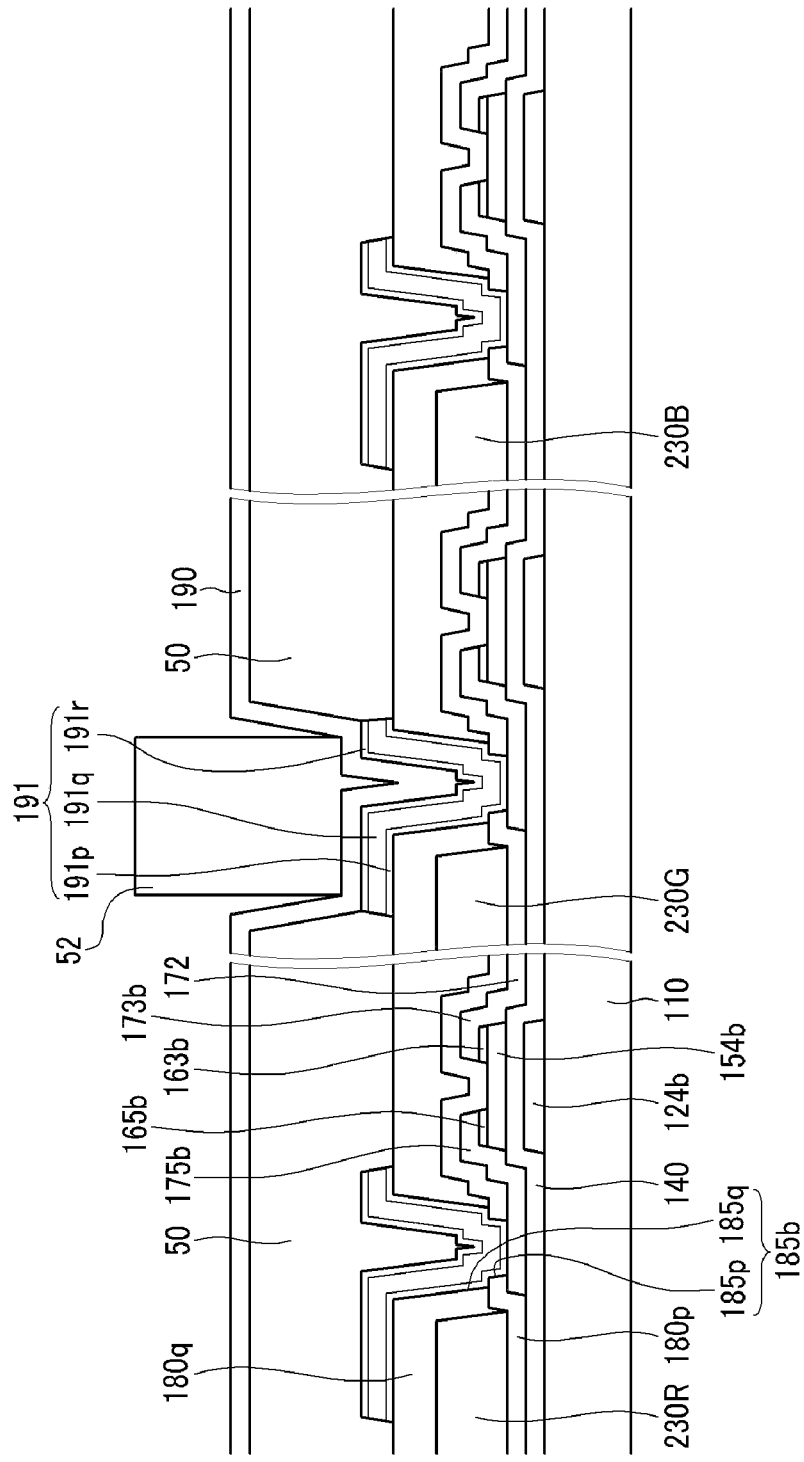
FIG. 24 and FIG. 25 are cross-sectional views of the organic light emitting device shown in FIG. 21 taken along lines XXII-XXII'-XXII"-XXII'" and XXIII-XXIII'-XXIII", and showing an intermediate step following that of FIG. 22 and FIG. 23.
Figure 25:
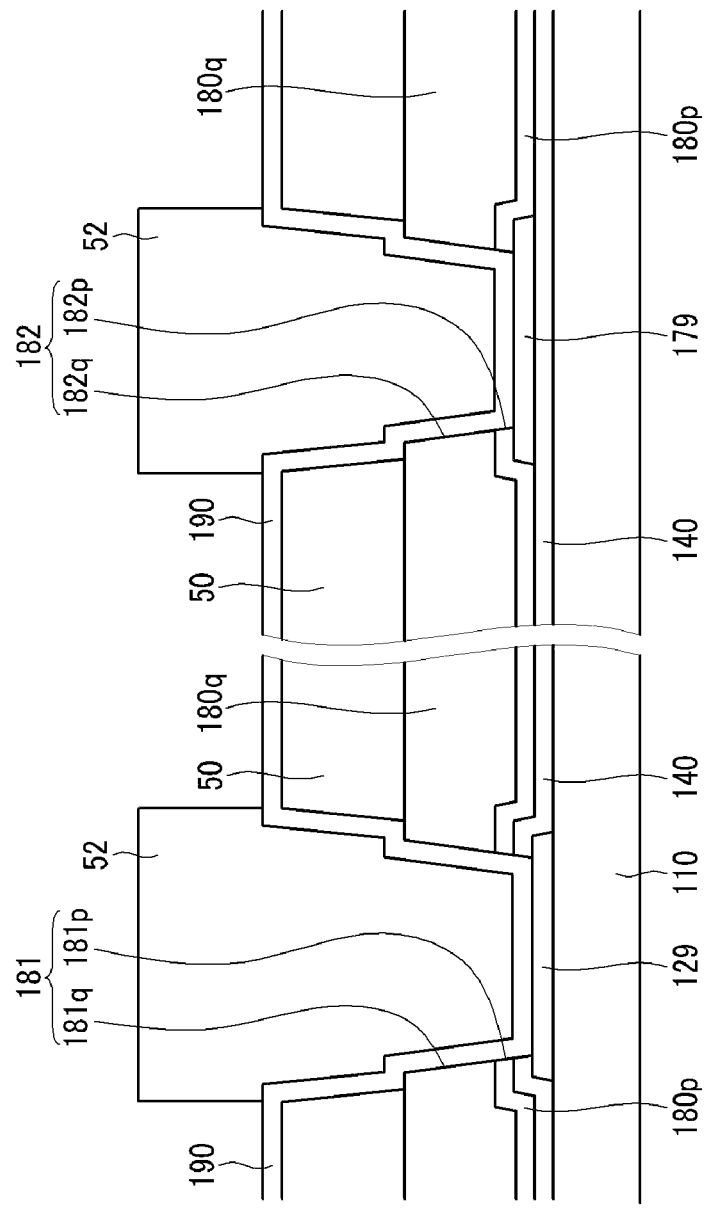

FIG. 5, FIG. 8, FIG. 13, FIG. 18, FIG. 21, and FIG. 26 are layout views showing intermediate steps of a manufacturing method of the organic light emitting device shown in FIG. 2 according to an exemplary embodiment of the present invention. FIG. 6 and FIG. 7 are cross-sectional views of the organic light emitting device shown in FIG. 5 taken along lines VI-VI'-VI"-VI'" and VII-VII'-VII", respectively. FIG. 9 and FIG. 10 are cross-sectional views of the organic light emitting device shown in FIG. 8 taken along lines IX-IX'-IX"-IX'" and X-X'-X", respectively. FIG. 11 and FIG. 12 are cross-sectional views of the organic light emitting device shown in FIG. 8 taken along lines IX-IX'-IX"-IX'" and X-X'-X", respectively, and showing an intermediate step following that of FIG. 9 and FIG. 10. FIG. 14 and FIG. 15 are cross-sectional views of the organic light emitting device shown in FIG. 13 taken along lines XIV-XIV'-XIV"-XIV'" and XV-XV'-XV", respectively. FIG. 16 and FIG. 17 are cross-sectional views of the organic light emitting device shown in FIG. 13 taken along lines XIV-XIV'-XIV"-XIV'" and XV-XV'-XV", respectively, and showing an intermediate step following that of FIG. 14 and FIG. 15. FIG. 19 and FIG. 20 are cross-sectional views of the organic light emitting device shown in FIG. 18 taken along lines XIX-XIX'-XIX"-XIX'" and XX-XX'-XX", respectively. FIG. 22 and FIG. 23 are cross-sectional views of the organic light emitting device shown in FIG. 21 taken along lines XXII-XXII'-XXII"-XXII'" and XXIII-XXIII'-XXIII", respectively. FIG. 24 and FIG. 25 are cross-sectional views of the organic light emitting device shown in FIG. 21 taken along lines XXII-XXII'-XXII"-XXII'" and XXIII-XXIII'-XXIII", respectively, and showing an intermediate step following that of FIG. 22 and FIG. 23. FIG. 27 and FIG. 28 are cross-sectional views of the organic light emitting device shown in FIG. 26 taken along lines XXVII-XXVII'-XXVII"-XXVII'" and XXVIII-XXVIII'-XXVIII".

Figure 5:
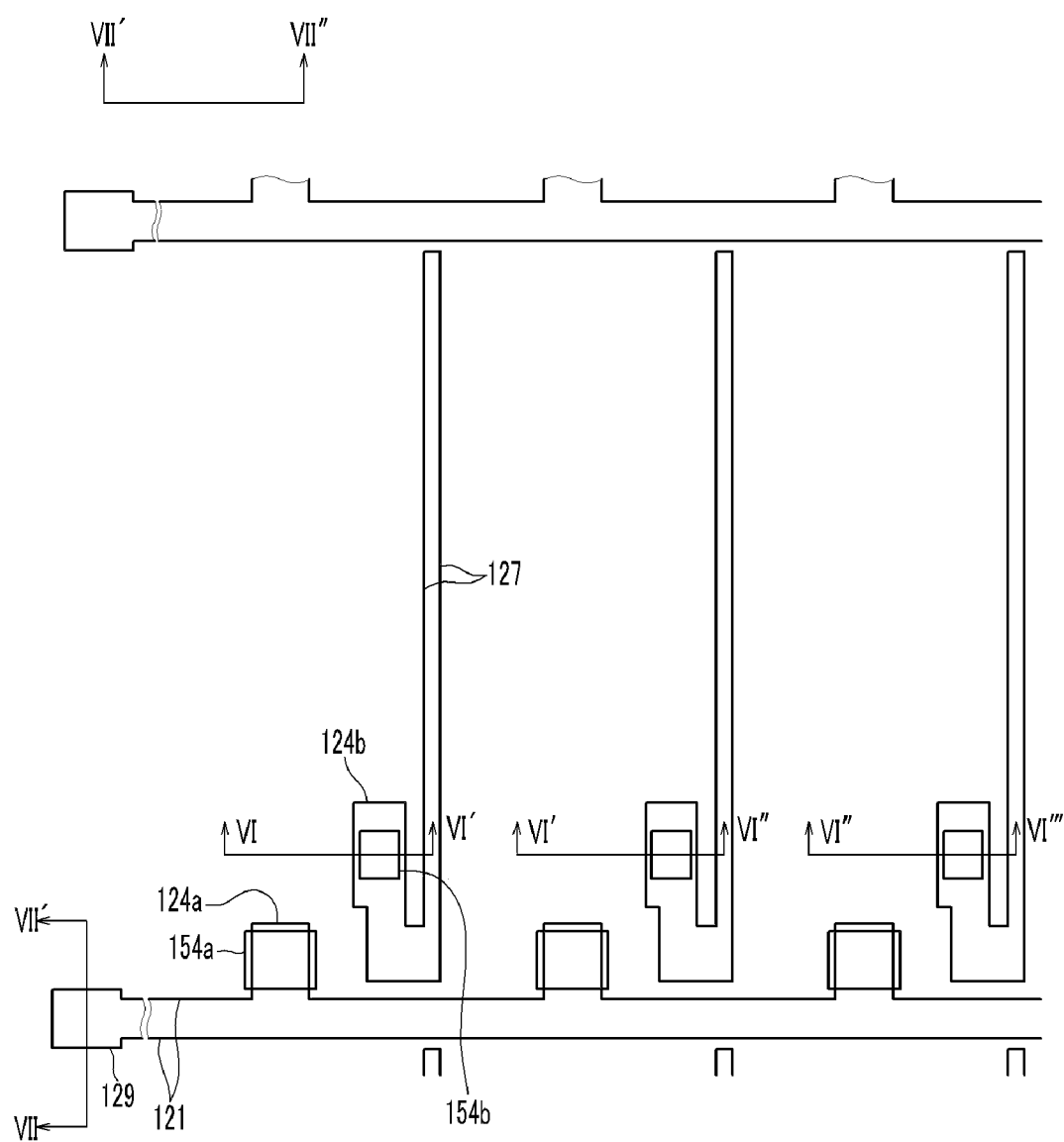
FIG. 5, FIG. 8, FIG. 13, FIG. 18, FIG. 21, and FIG. 26 are layout views showing intermediate steps of a manufacturing method of the organic light emitting device shown in FIG. 2, according to an exemplary embodiment of the present invention.
Figure 6:
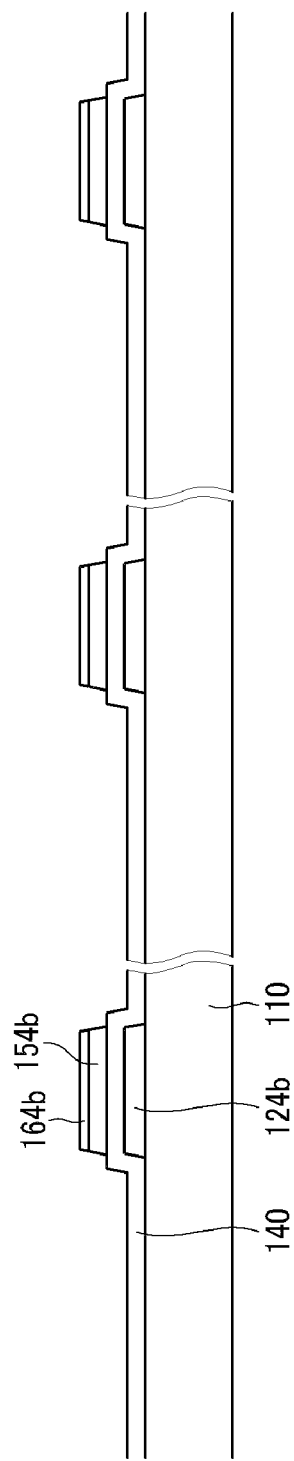
FIG. 6 and FIG. 7 are cross-sectional views of the organic light emitting device shown in FIG. 5 taken along lines VI-VI'-VI"-VI'" and VII-VII'-VII", respectively.
Figure 7:
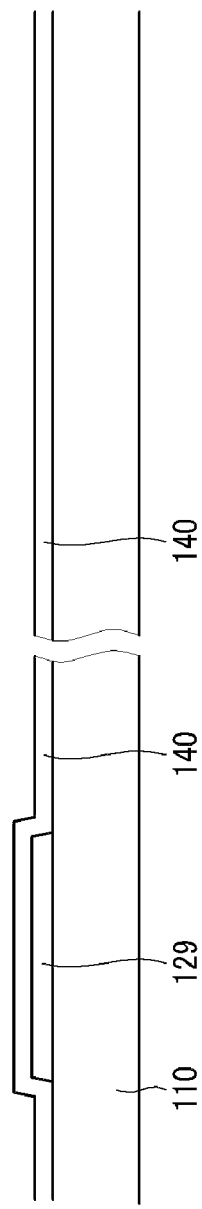

Referring to FIG. 5, FIG. 6, and FIG. 7, a gate conductor layer (not shown) made of a metal having low resistivity, such as an aluminum-containing metal, a silver-containing metal, and a copper-containing metal, is deposited by sputtering on an insulation substrate 110 made of transparent glass, and is patterned by photolithography to form a plurality of gate conductors including a plurality of scanning signal lines 121 including first control electrodes 124a and end portions 129, and a plurality of second control electrodes 124b including storage electrodes 127.

Next, a gate insulating layer 140 made of silicon nitride or silicon oxide is formed on the whole surface of the insulation substrate 110, and a semiconductor layer (not shown) of amorphous or crystallized silicon and a semiconductor layer (not shown) doped with an impurity are sequentially deposited by chemical vapor deposition and patterned by photolithography to form a plurality of first semiconductor islands 154a and a plurality of second semiconductor islands 154b, and a plurality of ohmic contact layers 164b.

Figure 8:
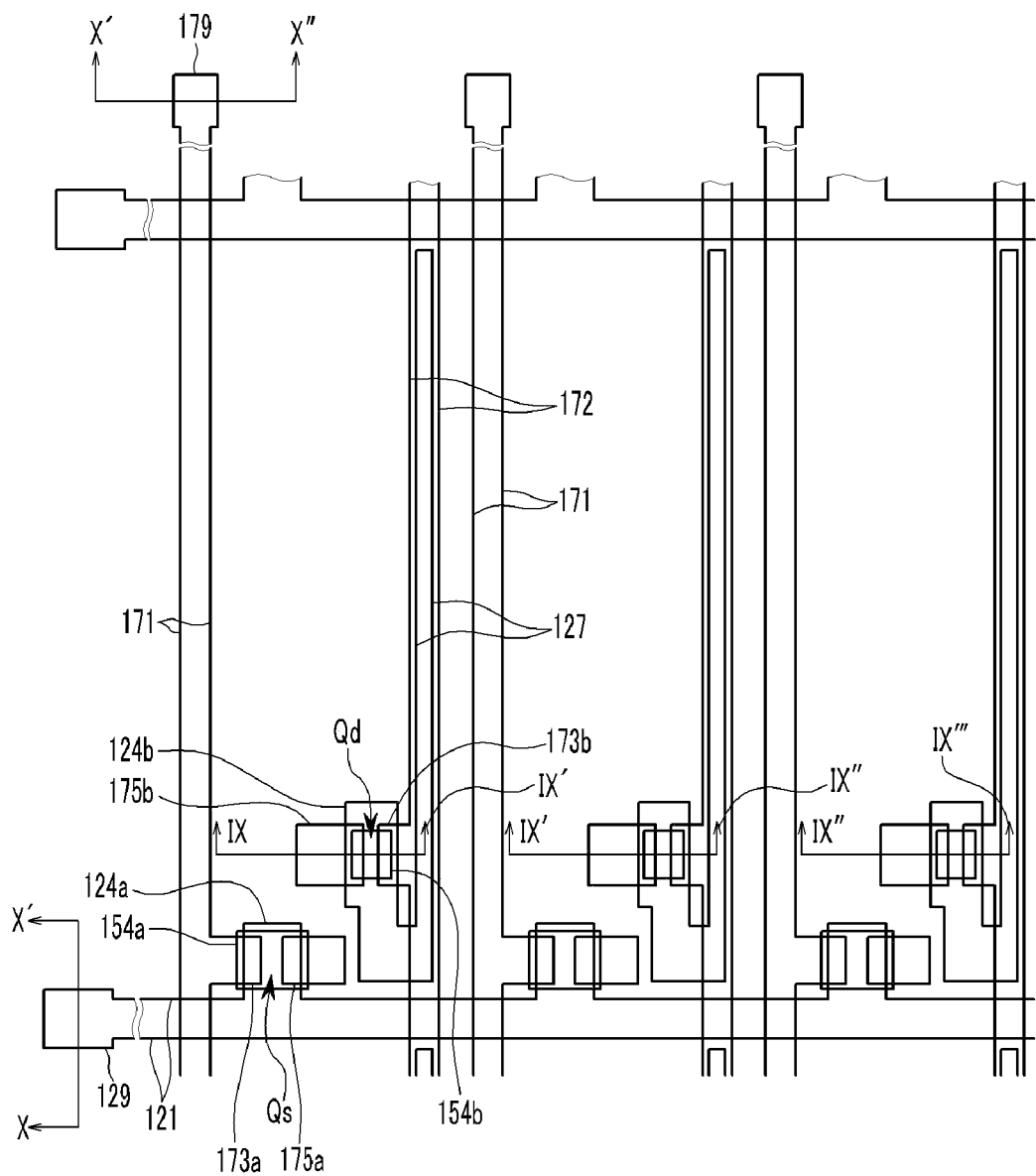
Figure 9:
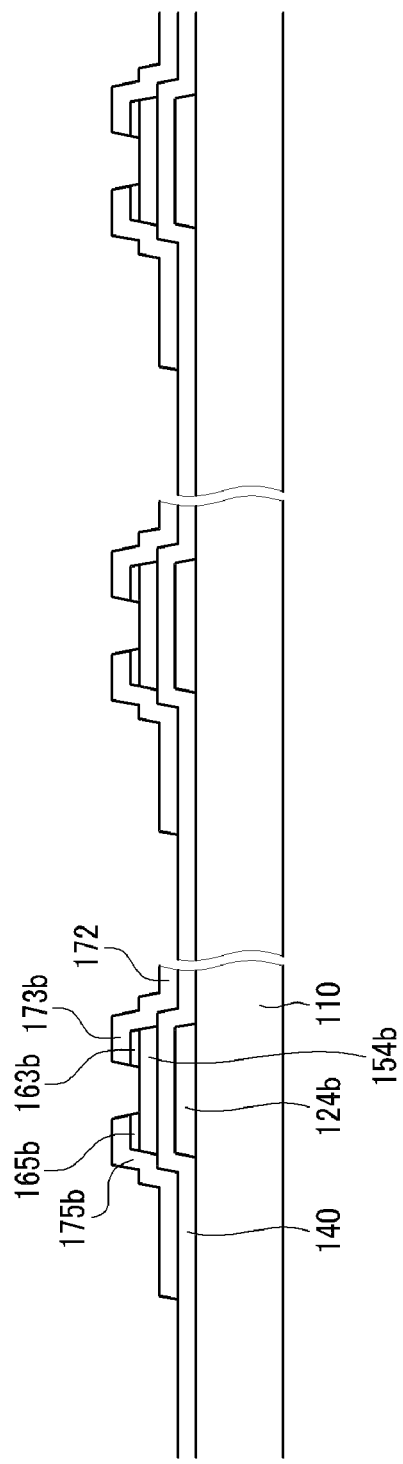
FIG. 9 and FIG. 10 are cross-sectional views of the organic light emitting device shown in FIG. 8 taken along lines IX-IX'-IX"-IX'" and X-X'-X".
Figure 10:
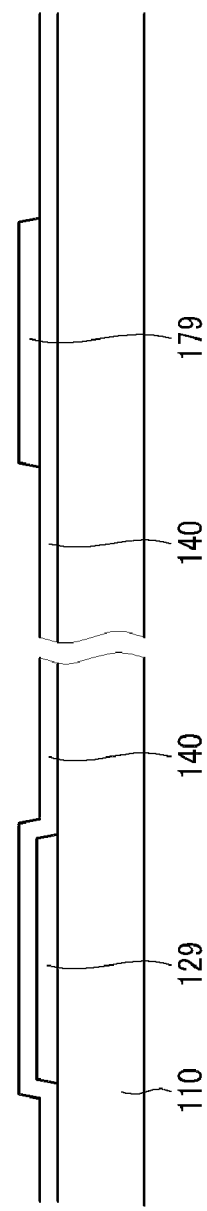

Next, referring to FIG. 8, FIG. 9, and FIG. 10, a data conductor layer (not shown) is deposited by sputtering on the gate insulating layer 140 and the ohmic contact layer 164b and patterned by photolithography to form a plurality of data conductors including a plurality of data lines 171 each having first input electrodes 173a and an end portion 179, a plurality of driving voltage lines 172 each having second input electrodes 173b, and a plurality of the first and second output electrodes 175a and 175b.

Next, the ohmic contact layer 164b is etched using the data lines 171 and the first and second output electrodes 175a and 175b as an etching mask to form a plurality of pairs of first ohmic contact islands (not shown) and a plurality of pairs of second ohmic contacts 163b and 165b, and the channels between the first and the second semiconductor islands 154a and 154b are exposed.

Referring to FIG. 11 and FIG. 12, an inorganic insulating material such as silicon nitride or silicon oxide is coated or deposited by chemical vapor deposition on the whole surface of the gate insulating layer 140, the data conductors, and the exposed semiconductor islands 154a and 154b to form a lower passivation layer 180p.

Next, color filters 230R, 230G, and 230B are formed on the lower passivation layer 180p. The color filters 230R, 230G, and 230B may be formed by a solution process such as spin coating or inkjet printing, or by deposition using a shadow mask.

Next, an upper passivation layer 180q of an organic insulating material is deposited on the lower passivation layer 180p and the color filters 230R, 230G, and 230B, and the upper passivation layer 180q is patterned to form a plurality of contact holes 181q, 182q, and 185q, exposing the lower passivation layer 180p by photolithography, and so on.

Figure 13:
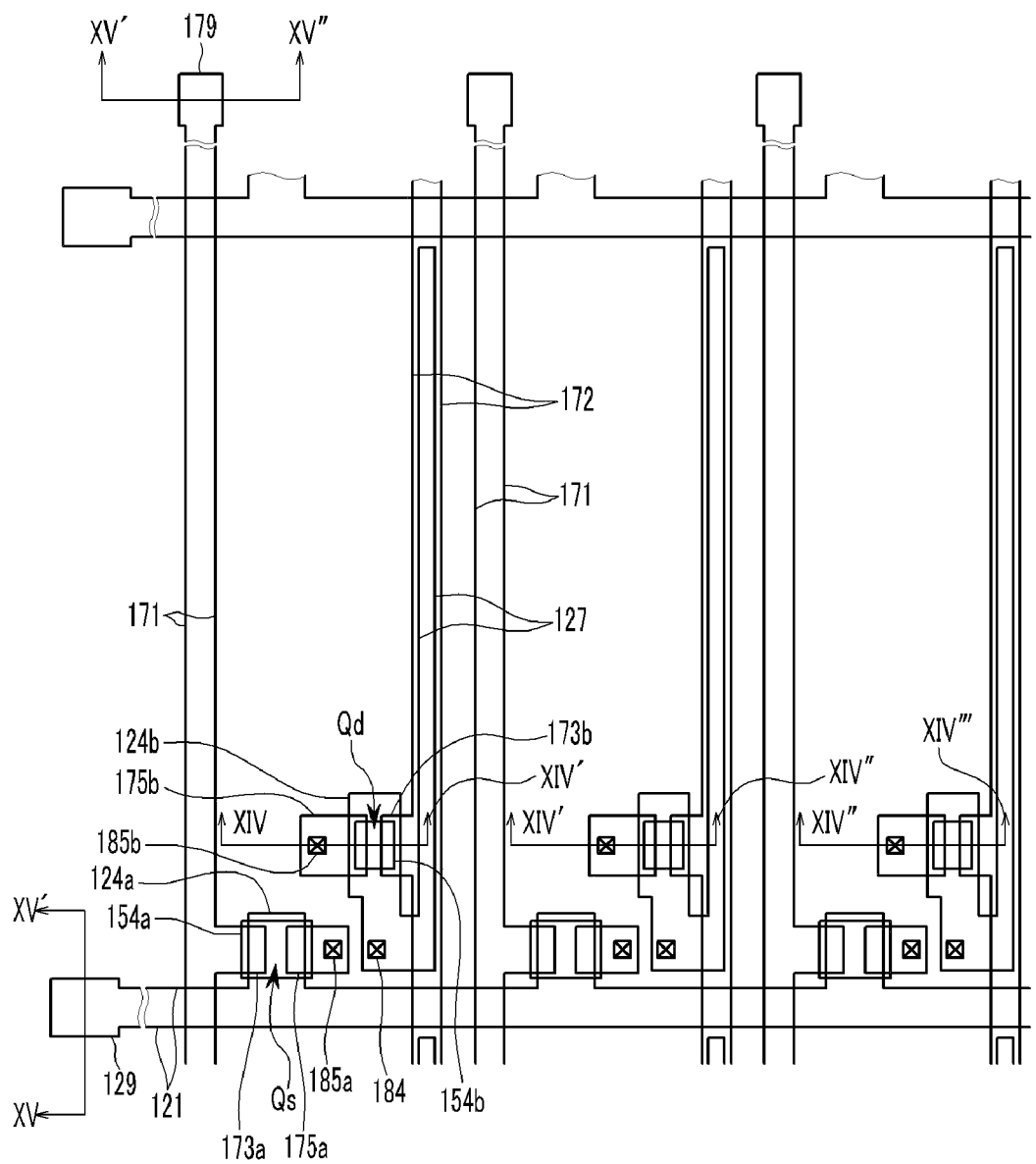
Figure 14:
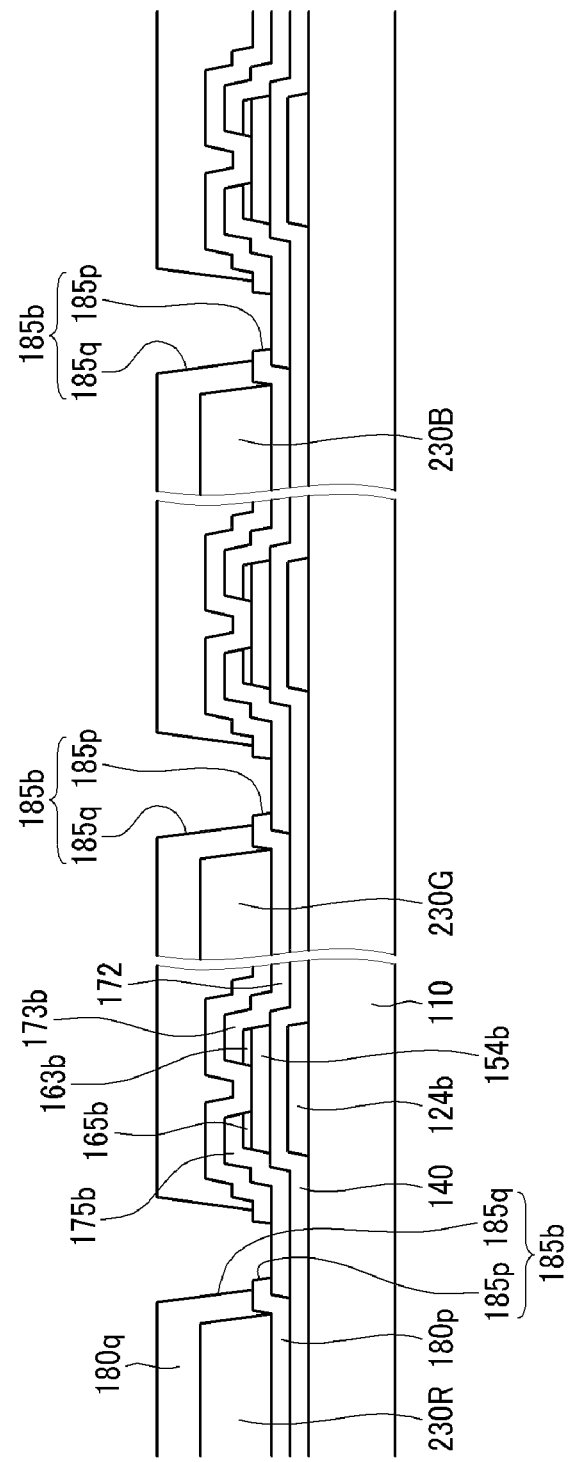
FIG. 14 and FIG. 15 are cross-sectional views of the organic light emitting device shown in FIG. 13 taken along lines XIV-XIV'-XIV"-XIV'" and XV-XV'-XV".
Figure 15:
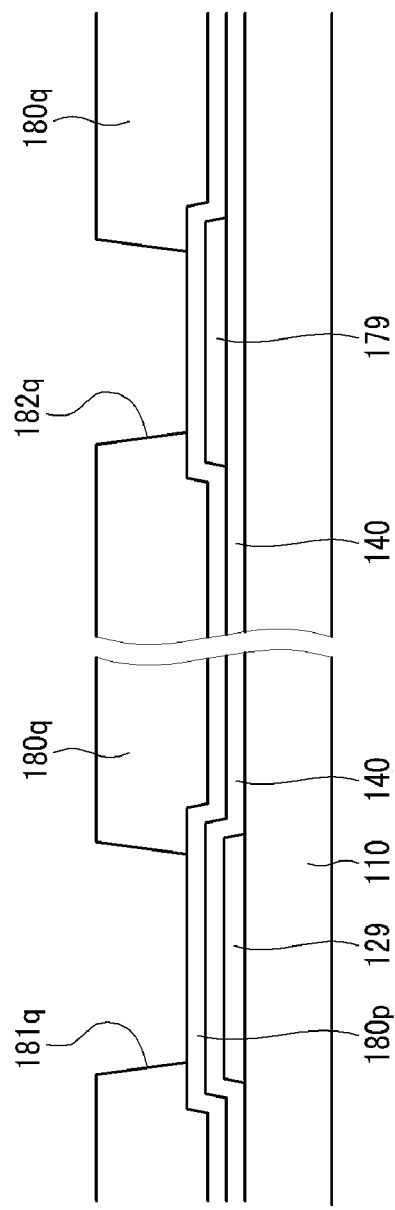

Next, referring to FIG. 13, FIG. 14, and FIG. 15, a photosensitive film pattern (not shown) is formed to expose a portion of the lower passivation layer 180p exposed by the contact holes 185q, except for on the contact holes 181q and 182q disposed on the end portions 129 and 179 of the scanning signal lines 121 and the data lines 171, and the exposed lower passivation layer 180p is etched. Accordingly, contact holes (not shown) exposing the first output electrodes 175a, contact holes 185p exposing the second output electrodes 175b, and contact holes (not shown) exposing the second control electrodes 124b are formed in the lower passivation layer 180p. Here, the gate insulating layer 140 is altogether etched to form the contact holes (not shown) exposing the second control electrodes 124b. The contact holes (not shown) in the lower and upper passivation layers 180p and 180q exposing the first output electrode 175a form a first contact hole 185a, and the contact holes 185p and 185q exposing the second output electrode 175b form a second contact hole 185b. Also, the contact holes (not shown) of the lower and upper passivation layers 180p and 180q and the gate insulating layer 140 exposing the second control electrode 124b also form a contact hole 184.

Here, the lower passivation layer 180p disposed on the end portions 129 and 179 of the scanning signal lines 121 and the data lines 171 is not removed.

Referring to FIG. 16 and FIG. 17, a lower electrode layer 190p made of IZO or ITO, a transflective metal electrode layer 190q made of a metal having high reflectivity such as silver or aluminum, and an upper electrode layer 190r made of a material such as IZO or ITO are sequentially deposited on the upper passivation layer 180q.

Next, a first photosensitive film pattern 49 is formed, which exposes the upper electrode layer 190r disposed on the end portions 129 and 179 of the scanning signal lines 121 and the data lines 171, and covers the upper electrode layer 190r of the red, green, and blue pixels R, G, and B.

Figure 18:
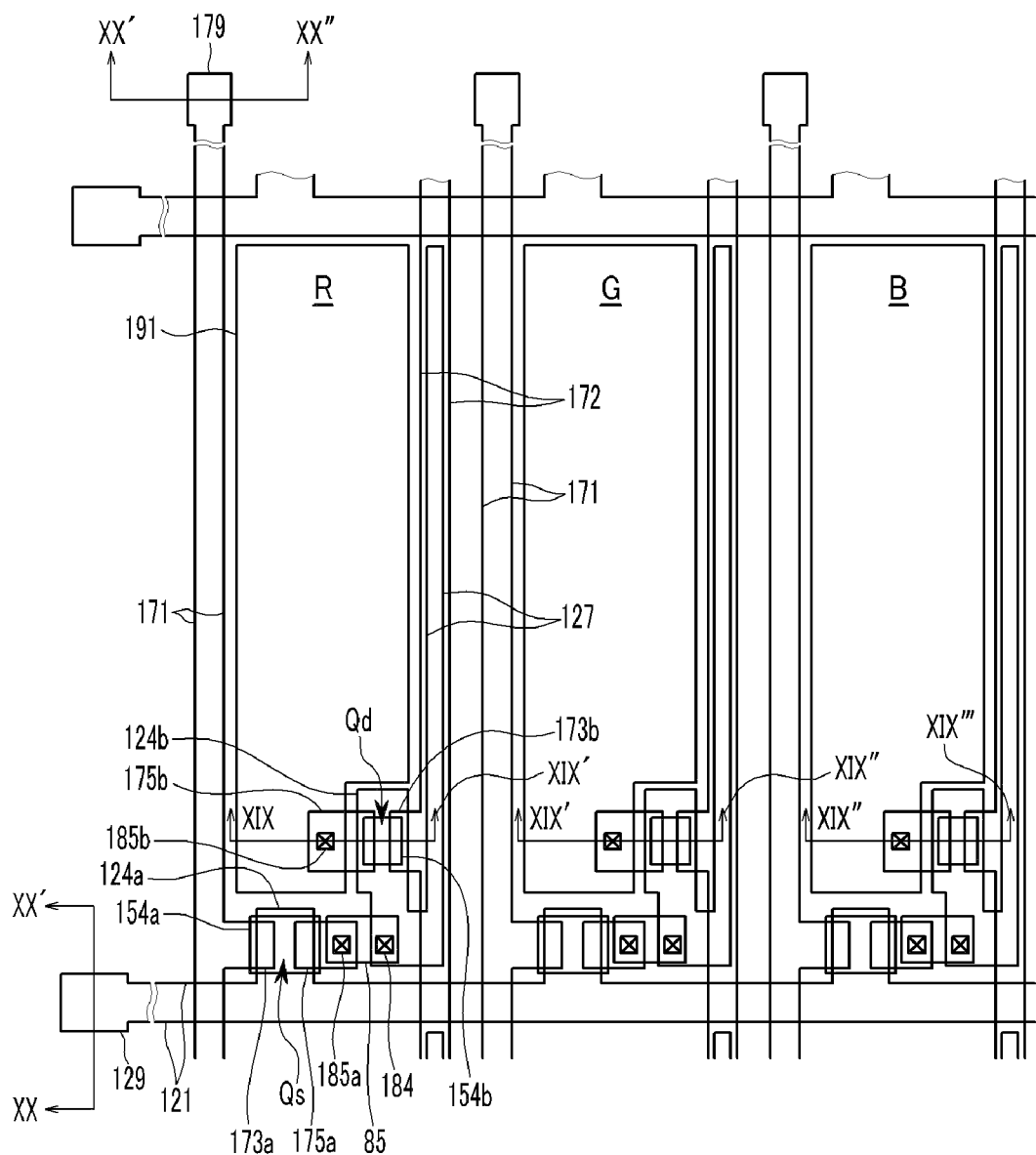
Figure 19:
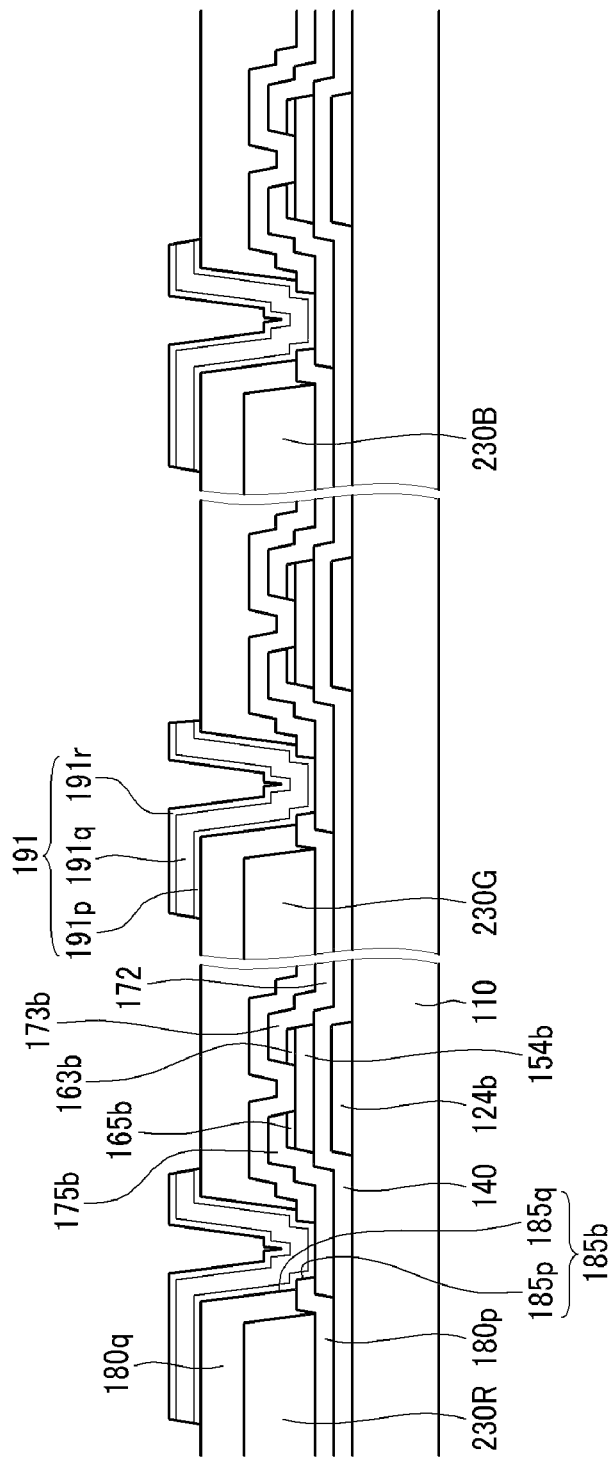
FIG. 19 and FIG. 20 are cross-sectional views of the organic light emitting device shown in FIG. 18 taken along lines XIX-XIX'-XIX"-XIX'" and XX-XX'-XX".
Figure 20:
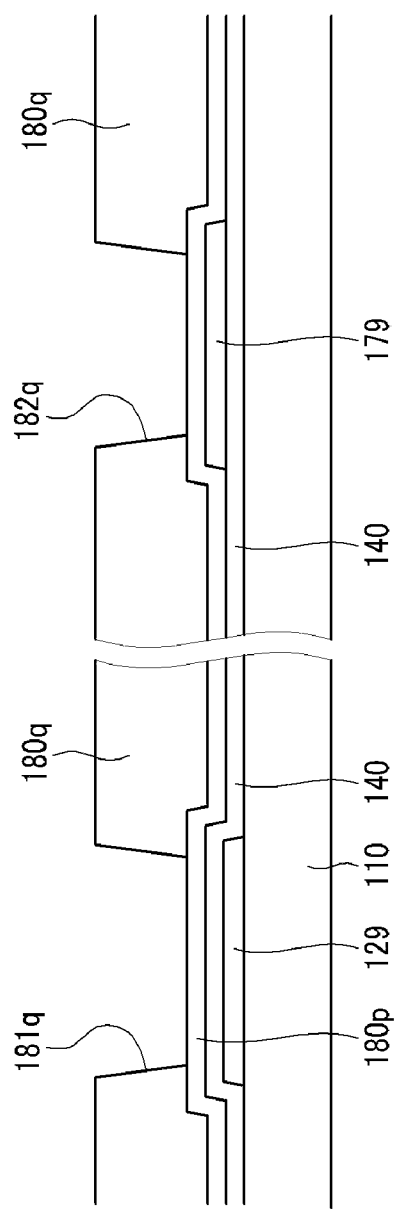

Referring to FIG. 18, FIG. 19, and FIG. 20, the lower electrode layer 190p, the transflective metal electrode layer 190q, and the upper electrode layer 190r are etched using the first photosensitive film pattern 49 as an etching mask to form a plurality of pixel electrodes 191 including a plurality of lower electrodes 191p, transflective metal electrodes 191q, and upper electrodes 191r respectively on the red, green, and blue pixels R, G, and B. Here, the lower electrode layer 190p, the transflective metal electrode layer 190q, and the upper electrode layer 190r that are deposited on the end portions of the scanning signal lines 121 and the data lines 171 are removed by photolithography.

Figure 21:
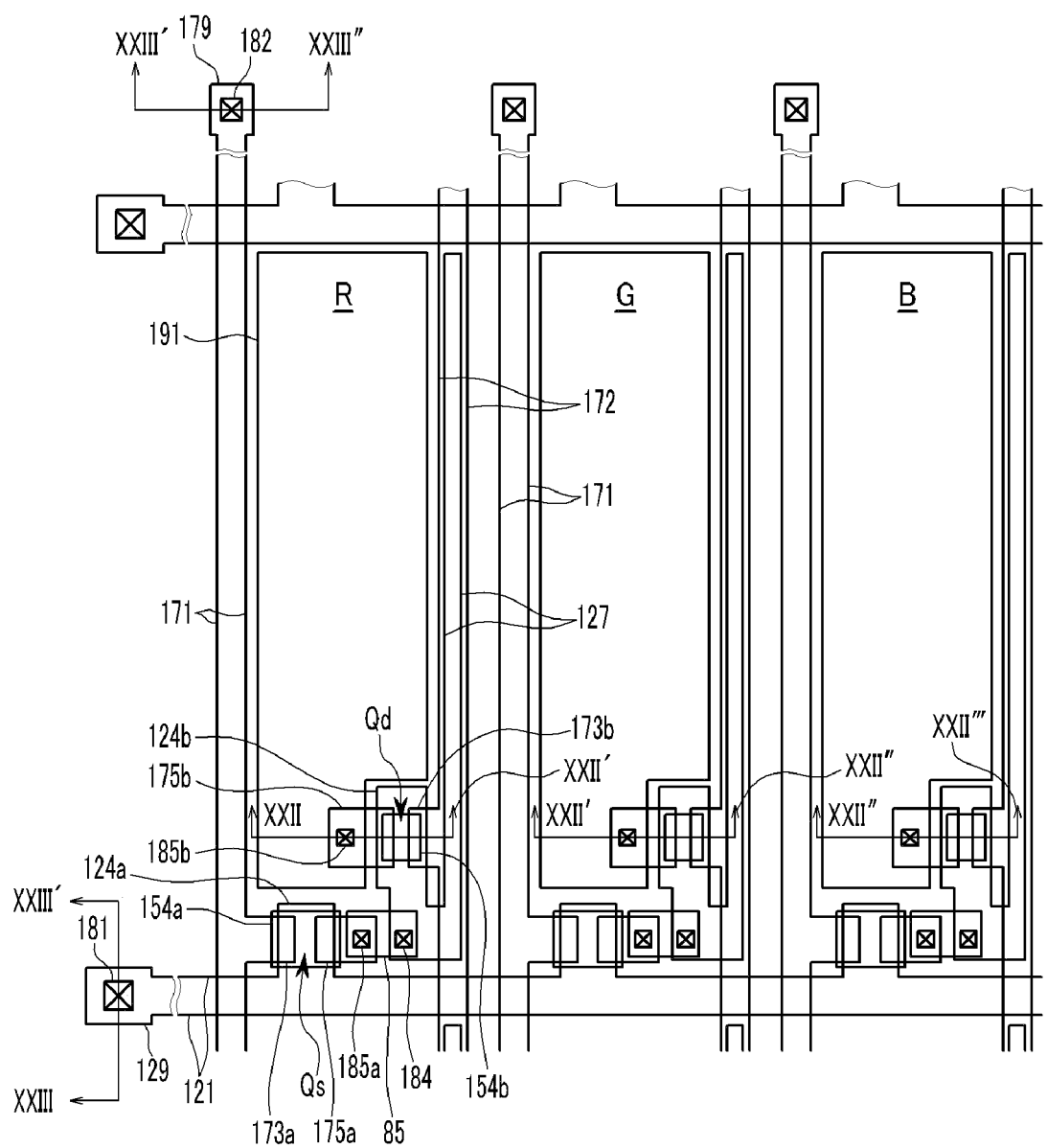
Figure 22:
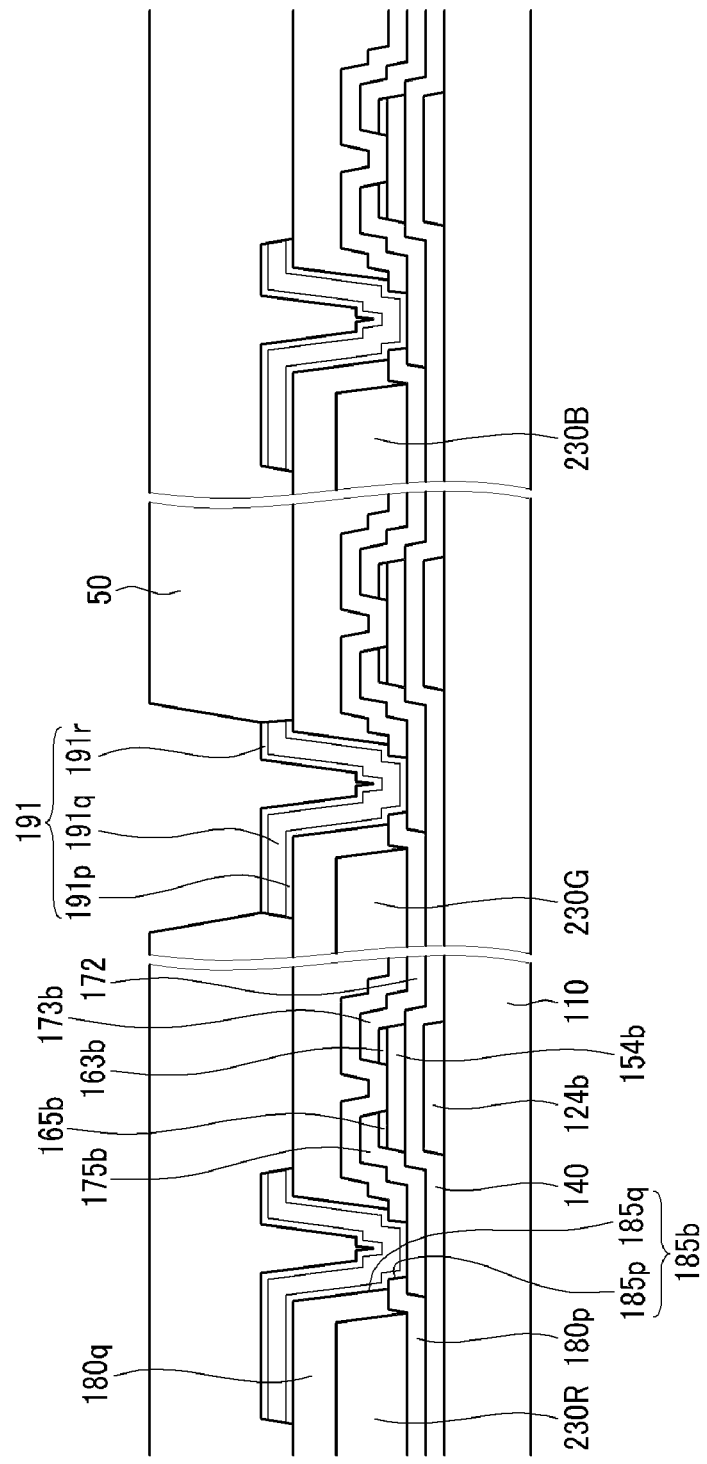
FIG. 22 and FIG. 23 are cross-sectional views of the organic light emitting device shown in FIG. 21 taken along lines XXII-XXII'-XXII"-XXII'" and XXIII-XXIII'-XXIII".
Figure 23:
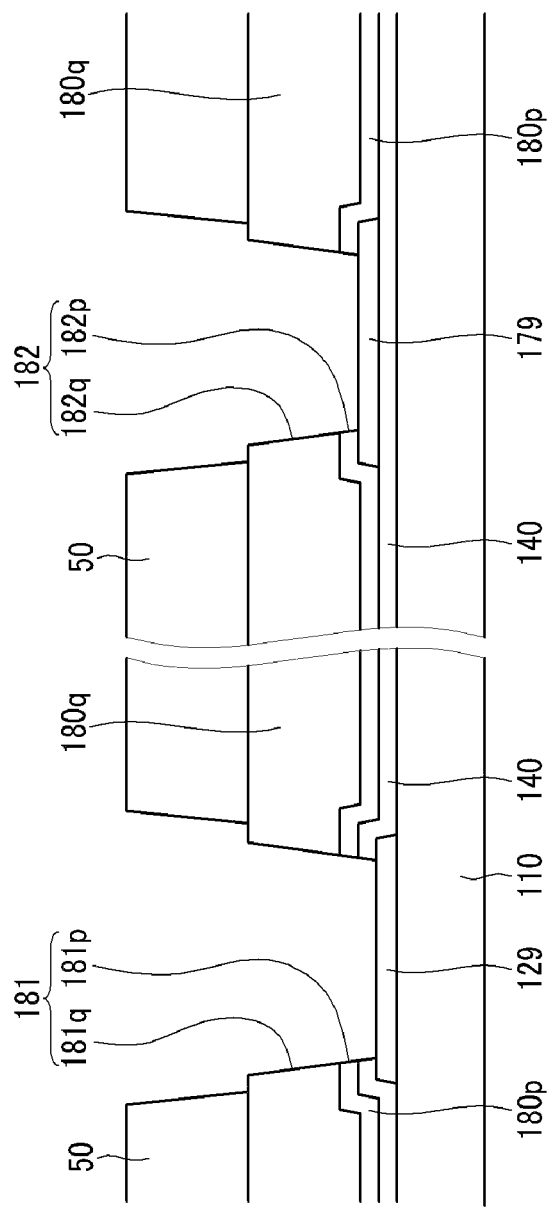

Referring to FIG. 21, FIG. 22, and FIG. 23, a photosensitive film is coated on the upper passivation layer 180q and the upper electrode 191r, and is exposed to light and developed to form a second photosensitive film pattern 50 that exposes the upper electrode 191r of the green pixel G, and exposes the contact holes 181q and 182q disposed on the end portions 129 and 179 of the scanning signal lines 121 and the data lines 171 as well as a surrounding portion of the upper passivation layer 180q.

Next, the lower passivation layer 180p and the gate insulating layer 140 exposed by the contact holes 181q are etched by using the second photosensitive film pattern 50 and the upper passivation layer 180q as a mask to form contact holes 181p exposing the end portions 129 of the scanning signal lines 121, thereby completing the gate contact holes 181. Also, the lower passivation layer 180p exposed by the contact holes 182q is etched using the second photosensitive film pattern 50 and the upper passivation layer 180q as a mask to form contact holes 182p exposing the end portions 179 of the data lines 171, thereby completing data contact holes 182.

Referring to FIG. 24 and FIG. 25, a conductive supplementary member layer 190 made of IZO or ITO is deposited by sputtering. Next, a third photosensitive film pattern 52 is formed, covering the conductive supplementary member layer 190 at positions corresponding to the upper electrode 191r of the green pixel G and the gate contact holes 181 and the data contact holes 182 as well as the circumference thereof.

Figure 26:
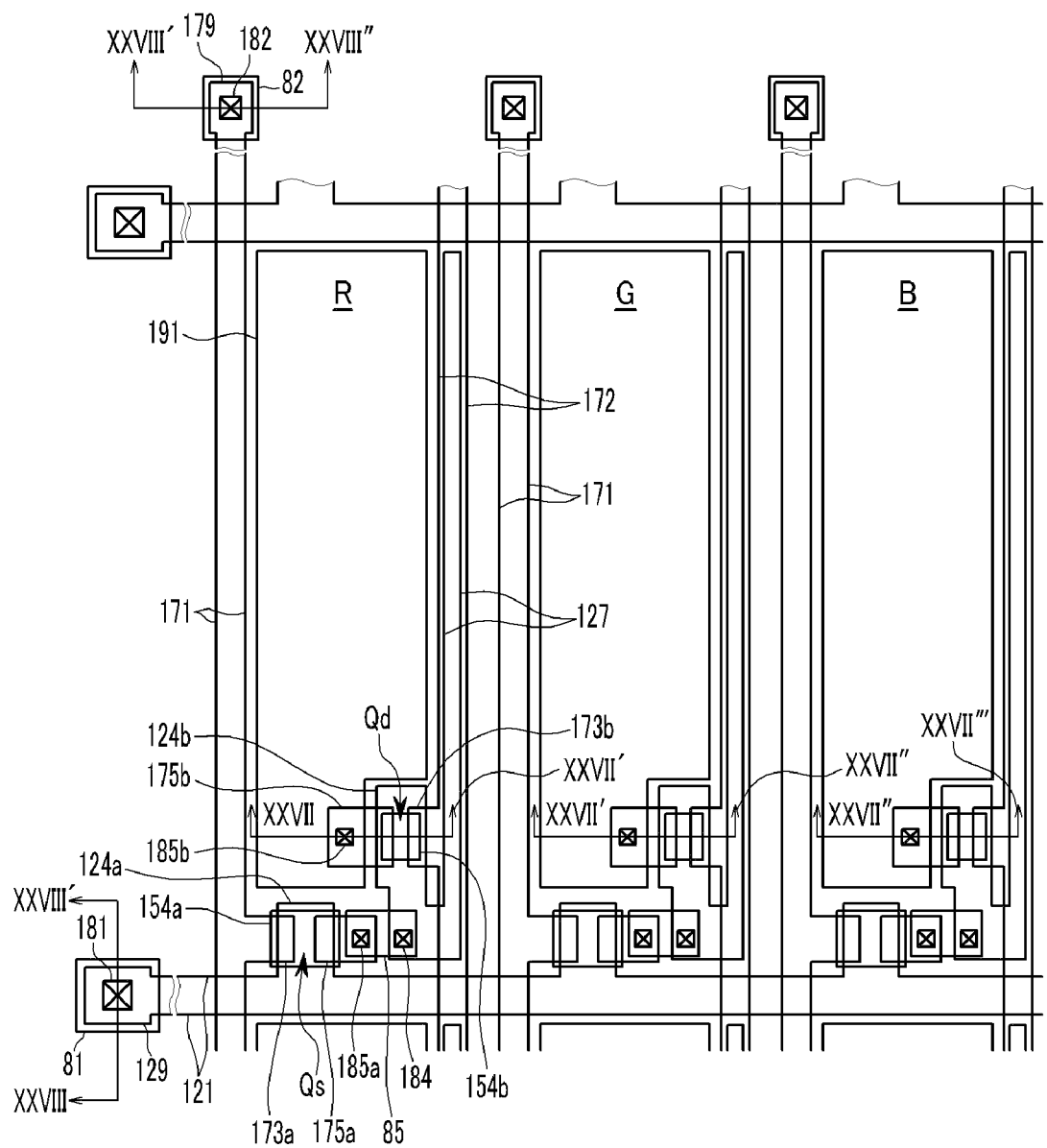
Figure 27:
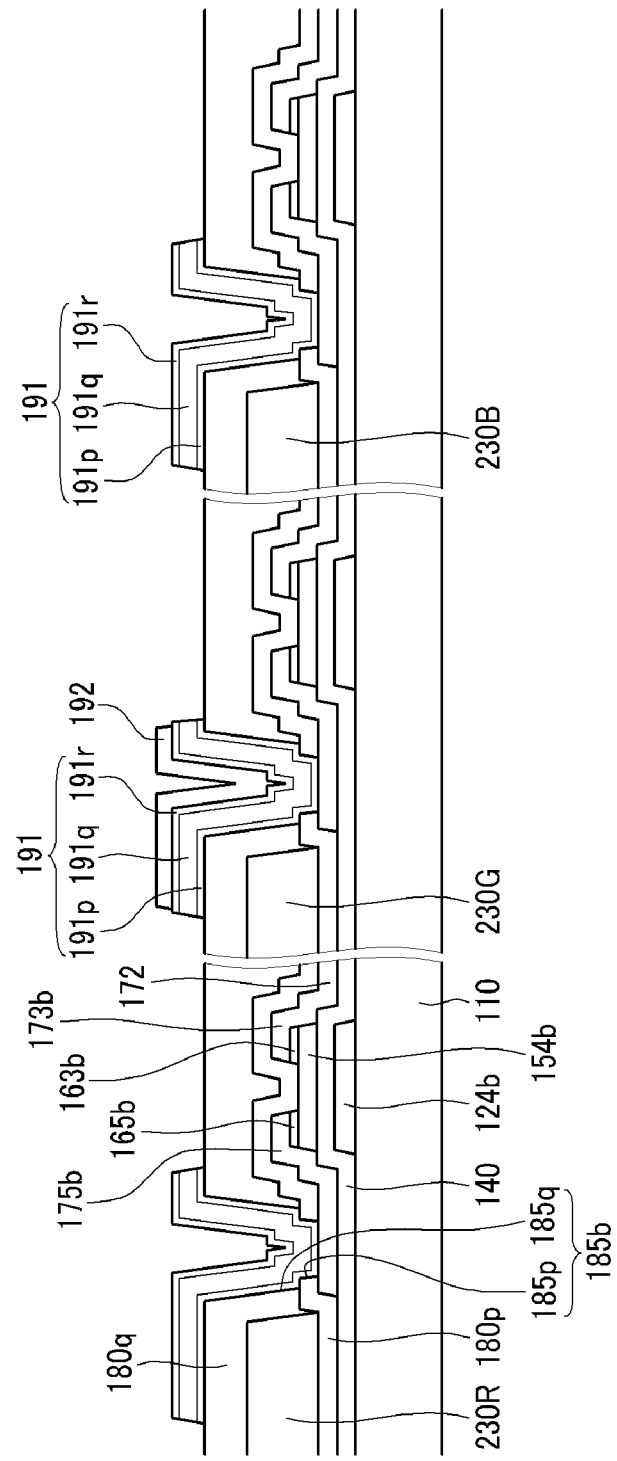

Referring to FIG. 26, FIG. 27, and FIG. 28, the conductive supplementary member layer 190 is etched using the third photosensitive film pattern 52 as an etching mask to form supplementary members 192 of the green pixels G and contact assistants 81 and 82. Next, the second and third photosensitive film patterns 50 and 52 are removed.

Alternatively, the second photosensitive film pattern 50 may be lifted off after depositing the conductive supplementary member layer 190 without formation of the third photosensitive film pattern 52 to form the supplementary members 192 of the green pixels G and the contact assistants 81 and 82.

Differently from the present embodiment, the second photosensitive film pattern 50 may be formed to cover the upper electrode 191r of the green pixel G and expose the upper electrodes 191r of the red pixel R and the blue pixel B. Also, the third photosensitive film pattern 52 may be formed to cover the conductive supplementary member layer 190 at positions corresponding to the upper electrodes 191r of the red and blue pixels R and B. Consequently, supplementary members (not shown) may be formed in the red and blue pixels R and B.

Finally, as shown in FIG. 2, FIG. 3, and FIG. 4, a white organic light emitting member 370 and a common electrode 270 are sequentially formed.

Accordingly, without additional photolithography processes, the contact assistants 81 and 82 contacting the end portions 129 and 179 of the scanning signal lines 121 and the data lines 171 may be formed with the same process as the supplementary members 192 of the green pixels G.

Further, without an additional photolithography process, the multilayers 191p, 191q, and 191r forming the pixel electrodes 191 may be removed on the end portions 129 and 179 of the scanning signal lines 121 and the data lines 171, and the contact assistants 81 and 82 comprising a single layer may be formed, so that a fluctuation and increase in the contact resistance at the end portions 129 and 179 may be avoided, and characteristics of the transistors of Qs and Qd and the organic light emitting device may be improved.

The present invention may be applied to organic light emitting devices having various structures.

According to exemplary embodiments of the present invention, display characteristics of an organic light emitting device and characteristics of transistors used therein may be improved, and color reproducibility and light efficiency of an organic light emitting device may be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. An organic light emitting device, comprising:
 a plurality of scanning signal lines, each scanning signal line to transmit a scanning signal and comprising an end portion;
 a first contact assistant directly connected to the end portion of the scanning signal line;
 a plurality of data lines crossing the scanning signal lines, each data line to transmit a data signal and comprising an end portion;
 a second contact assistant directly connected to the end portion of the data line;
 a driving voltage line to transmit a driving voltage; and
 a first pixel, a second pixel, and a third pixel being alternately arranged,
 wherein each of the first pixel, the second pixel, and the third pixel comprises:

a switching transistor connected to the scanning signal line and the data line, a driving transistor connected to the switching transistor and the driving voltage line, the driving transistor comprising an output terminal, a pixel electrode connected to the output terminal of the driving transistor, the pixel electrode comprising at least a transflective electrode, a lower electrode arranged under the transflective electrode, and an upper electrode arranged on the transflective electrode, an organic light emitting member arranged on the pixel electrode, and a common electrode arranged on the organic light emitting member, wherein the first pixel further comprises a supplementary member arranged on the pixel electrode, and wherein the first contact assistant and the second contact assistant each comprise the same material as the supplementary member.

2. The organic light emitting device of claim 1, wherein the lower electrode and the upper electrode contact the transflective electrode.

3. The organic light emitting device of claim 2, wherein the transflective electrode comprises a metal, and the lower electrode and the upper electrode each comprise a conductive metal oxide.

4. The organic light emitting device of claim 3, wherein the transflective electrode comprises silver (Ag) or aluminum (Al), and the lower electrode and the upper electrode each comprise indium tin oxide (ITO) or indium zinc oxide (IZO).

5. The organic light emitting device of claim 3, wherein the transflective electrode has a thickness in a range of 50 Å-250Å.

6. The organic light emitting device of claim 1, wherein the supplementary member, the first contact assistant, and the second contact assistant have the same thickness.

7. The organic light emitting device of claim 6, wherein at least one of the supplementary member, the first contact assistant, and the second contact assistant comprises a transparent conductive material comprising ITO or IZO.

8. The organic light emitting device of claim 1, further comprising:

a passivation layer disposed between the switching transistor and the driving transistor, and the pixel electrode, wherein the passivation layer comprises a first contact hole exposing the output terminal of the driving transistor, a second contact hole exposing the end portion of the scanning signal line, and a third contact hole exposing the end portion of the data line.

9. The organic light emitting device of claim 8, wherein:

the pixel electrode is connected to the output terminal through the first contact hole;

the first contact assistant is connected to the end portion of the scanning signal line through the second contact hole; and the second contact assistant is connected to the end portion of the data line through the third contact hole.

10. The organic light emitting device of claim 8, wherein the passivation layer comprises a lower layer and an upper layer.

11. The organic light emitting device of claim 10, wherein the lower layer comprises an inorganic material comprising silicon nitride or silicon oxide, and the upper layer comprises an organic material.

12. The organic light emitting device of claim 1, wherein the organic light emitting member comprises a white organic light emitting member, and the first pixel, the second pixel, and the third pixel further comprise a first color filter, a second color filter, and a third color filter disposed under the pixel electrode, respectively.

13. The organic light emitting device of claim 12, wherein the first color filter, the second color filter, and the third color filter respectively represent a red color, a green color, and a blue color.

* * * * *